US010186221B2

(12) United States Patent
Shang et al.

(10) Patent No.: US 10,186,221 B2
(45) Date of Patent: Jan. 22, 2019

(54) SHIFT REGISTER, DRIVING METHOD THEREOF, GATE DRIVING CIRCUIT AND DISPLAY DEVICE

(71) Applicant: Boe Technology Group Co., Ltd., Beijing (CN)

(72) Inventors: Guangliang Shang, Beijing (CN); Haoliang Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/512,284

(22) PCT Filed: Feb. 19, 2016

(86) PCT No.: PCT/CN2016/074136
§ 371 (c)(1),
(2) Date: Mar. 17, 2017

(87) PCT Pub. No.: WO2017/054399
PCT Pub. Date: Apr. 6, 2017

(65) Prior Publication Data
US 2017/0278473 A1     Sep. 28, 2017

(30) Foreign Application Priority Data

Sep. 28, 2015   (CN) .......................... 2015 1 0627519

(51) Int. Cl.
*G11C 19/00*     (2006.01)
*G09G 3/36*     (2006.01)
(Continued)

(52) U.S. Cl.
CPC ............ *G09G 3/3674* (2013.01); *G09G 3/36* (2013.01); *G11C 8/04* (2013.01); *G11C 19/184* (2013.01);
(Continued)

(58) Field of Classification Search
None
See application file for complete search history.

(56) References Cited

U.S. PATENT DOCUMENTS 8,059,780 B2    11/2011  Wang et al.
2008/0101529 A1*  5/2008  Tobita .................. G09G 3/3677
377/64
(Continued)

FOREIGN PATENT DOCUMENTS

CN     101383133       3/2009
CN     101383133 A     3/2009
(Continued)

OTHER PUBLICATIONS

International Search Report for PCT/CN2016/074136 dated Jun. 27, 2016.
(Continued)

*Primary Examiner* — Tuan T Lam
(74) *Attorney, Agent, or Firm* — Calfee, Halter & Griswold LLP

(57) ABSTRACT

A shift register, a driving method, a gate driving circuit and a display device are disclosed. The input module controls the potential of the first node. The first reset module controls the potential of the first node. The second reset module controls the potential of the driving signal output terminal. The first output module controls the potential of the driving signal output terminal under the control of the first node. The second output module controls the potential of the driving signal output terminal under the control of the second node. The pull-down driving module controls the potentials of the first node and the second node. Since the node control signal at the node control signal terminal can eliminate the noise on
(Continued)

the first node resulting from the change in the first clock signal, the output stability of the shift register can be improved.

4 Claims, 17 Drawing Sheets

(51) Int. Cl.
    *G11C 19/28*     (2006.01)
    *G11C 8/04*     (2006.01)
    *G11C 19/18*     (2006.01)

(52) U.S. Cl.
    CPC ............ *G11C 19/28* (2013.01); *G11C 19/287* (2013.01); *G09G 3/3677* (2013.01); *G09G 2310/0286* (2013.01)

(56) References Cited

U.S. PATENT DOCUMENTS

| | | | | |
|---|---|---|---|---|
| 2011/0058640 A1* | 3/2011 | Shang | ................... | G11C 19/28 377/64 |
| 2012/0113088 A1* | 5/2012 | Han | ................... | G09G 3/3674 345/212 |
| 2012/0188210 A1* | 7/2012 | Zhang | ................... | G09G 3/3677 345/204 |
| 2012/0262438 A1* | 10/2012 | Shang | ................... | G11C 19/28 345/211 |
| 2012/0269316 A1* | 10/2012 | Jang | ................... | G09G 3/3677 377/75 |
| 2014/0056399 A1* | 2/2014 | Shang | ................... | G11C 19/28 377/68 |
| 2014/0133621 A1* | 5/2014 | Shang | ................... | G11C 19/28 377/67 |
| 2015/0325181 A1* | 11/2015 | Wang | ................... | G09G 3/3677 377/64 |
| 2016/0111065 A1* | 4/2016 | Wang | ................... | G11C 19/28 345/213 |
| 2016/0253977 A1* | 9/2016 | Ohkawa | ................... | G09G 3/3677 345/213 |
| 2016/0300542 A1* | 10/2016 | Zhang | ................... | G11C 19/28 |
| 2016/0307641 A1* | 10/2016 | Zheng | ................... | G09G 3/3677 |
| 2016/0351159 A1* | 12/2016 | Yang | ................... | G09G 3/20 |

FOREIGN PATENT DOCUMENTS

| | | |
|---|---|---|
| CN | 102012591 | 4/2011 |
| CN | 102012591 A | 4/2011 |
| CN | 102629444 | 8/2012 |
| CN | 102651238 | 8/2012 |
| CN | 102651238 A | 8/2012 |
| CN | 202363089 | 8/2012 |
| CN | 202363089 U | 8/2012 |
| CN | 102654969 | 9/2012 |
| CN | 102654969 A | 9/2012 |
| CN | 102682699 | 9/2012 |
| CN | 202487125 | 10/2012 |
| CN | 102945657 | 2/2013 |
| CN | 105096902 | 11/2015 |
| JP | 2002197885 | 7/2002 |
| JP | 2002197885 A | 7/2002 |

OTHER PUBLICATIONS

Office action from Chinese Application No. 201510627519.7 dated Mar. 20, 2017.
Second Office Action for Chinese Patent Application No. 201510627519.7 dated Aug. 16, 2017.
Decision on Rejection for Chinese Patent Application No. 201510627519.7 dated Jan. 8, 2018.

\* cited by examiner

SHIFT REGISTER, DRIVING METHOD THEREOF, GATE DRIVING CIRCUIT AND DISPLAY DEVICE

RELATED APPLICATIONS

The present application is the U.S. national phase entry of PCT/CN2016/074136, with an international filing date of Feb. 19, 2016, which claims the benefit of Chinese Patent Application No. 201510627519.7, filed on Sep. 28, 2015, the entire disclosures of which are incorporated herein by reference.

FIELD

The present disclosure relates to the field of display technologies, and specifically to a shift register, a driving method thereof, a gate driving circuit and a display device.

BACKGROUND

In today's rapidly updating technology, liquid crystal displays have been widely used in electronic display products, such as televisions, computers, mobile phones and personal digital assistants. A liquid crystal display comprises a source driver, a gate driver, a liquid crystal display panel, and the like, wherein the liquid crystal display panel has an array of pixels while the gate driver is used to successively turn on the corresponding pixel rows in the array of pixels to transmit the pixel data outputted by the source driver to the pixels, thereby displaying an image to be displayed.

At present, the gate driver is generally formed by array process on an array substrate of the liquid crystal display, i.e. Gate Driver on Array (GOA) process. This integration process not only saves the cost, but also can achieve an aesthetic design in which two sides of the liquid crystal panel are symmetrical to each other. Meanwhile, it also omits the bonding area of the gate integrated circuit (IC) and the fan-out wiring space, realizing a design of narrow frame. Furthermore, this integration process can further eliminate the need for bonding process in the direction of gate scan lines, thereby improving the throughput and yield.

The existing gate driver usually consists of a plurality of cascaded shift registers, wherein the signals outputted from the driving signal output terminals of the shift registers of respective stages are generally controlled by a pull-up node and a clock signal. However, in an existing shift register, noises would occur to the pull-up node and the driving signal output terminal at a rising edge of the clock signal, which may lead to output errors.

SUMMARY

Embodiments of the present disclosure provide a shift register, a driving method thereof, a gate driving circuit and a display device so as to reduce or even eliminate at least some of the above issues existing in the prior art.

A shift register provided by embodiments of the present disclosure includes an input module, a first reset module, a second reset module, a first output module, a second output module and a pull-down driving module; wherein a first terminal of the input module is connected to an input signal terminal, a second terminal of the input module is connected to a first node; the input module is configured to control a potential of the first node under the control of the input signal terminal;

a first terminal of the first reset module is connected to a reference signal terminal, a second terminal of the first reset module is connected to a first reset control signal terminal, a third terminal of the first reset module is connected to the first node; the first reset module is configured to provide a reference signal of the reference signal terminal to the first node under the control of the first reset control signal terminal;

a first terminal of the second reset module is connected to a second reset control signal terminal, a second terminal of the second reset module is connected to the reference signal terminal, a third terminal of the second reset module is connected to a driving signal output terminal; the second reset module is configured to provide the reference signal to the driving signal output terminal under the control of the second reset control signal terminal;

a first terminal of the first output module is connected to a first clock signal terminal, a second terminal of the first output module is connected to the first node, a third terminal of the first output module is connected to the driving signal output terminal; the first output module is configured to provide a first clock signal of the first clock signal terminal to the driving signal output terminal under the control of the first node;

a first terminal of the second output module is connected to the reference signal terminal, a second terminal of the second output module is connected to a second node, a third terminal of the second output module is connected to the driving signal output terminal; the second output module is configured to provide the reference signal to the driving signal output terminal under the control of the second node;

a first terminal of the pull-down driving module is connected to a node control signal terminal, a second terminal of the pull-down driving module is connected to the reference signal terminal, a third terminal of the pull-down driving module is connected to the first node, a fourth terminal of the pull-down driving module is connected to the second node; the pull-down driving module is configured to control a potential of the second node to be a second potential when the potential of the first node is a first potential, and control the potential of the first node to be the second potential when the potential of the second node is the first potential;

when an effective pulse signal of the input signal terminal is a high-potential signal, the first potential is a high potential and the second potential is a low potential; when the effective pulse signal of the input signal terminal is a low-potential signal, the first potential is a low potential and the second potential is a high potential; a node control signal of the node control signal terminal is configured to eliminate a noise on the first node resulting from change in the first clock signal.

Alternatively, in the above shift register provided by embodiments of the present disclosure, when the effective pulse signal of the input signal terminal is a high-potential signal, the node control signal is a high-potential signal at least when the first clock signal is at a rising edge.

Alternatively, in the above shift register provided by embodiments of the present disclosure, when the effective pulse signal of the input signal terminal is a low-potential signal, the node control signal is a low-potential signal at least when the first clock signal is at a falling edge.

Alternatively, in the above shift register provided by embodiments of the present disclosure, the node control signal is a second clock signal.

Alternatively, in the above shift register provided by embodiments of the present disclosure, the node control signal is a direct current signal.

Alternatively, in the above shift register provided by embodiments of the present disclosure, a duty cycle of the second clock signal is 2% to 50%.

In an implementation, in the above shift register provided by embodiments of the present disclosure, the input module comprises a first switch transistor; wherein a gate and a source of the first switch transistor are both connected to the input signal terminal, a drain of the first switch transistor is connected to the first node.

In an implementation, in the above shift register provided by embodiments of the present disclosure, the first reset module comprises a second switch transistor; wherein a gate of the second switch transistor is connected to the first reset control signal terminal, a source of the second switch transistor is connected to the first node, a drain of the second switch transistor is connected to the reference signal terminal.

In an implementation, in the above shift register provided by embodiments of the present disclosure, the first output module comprises a third switch transistor and a capacitor; wherein a gate of the third switch transistor is connected to the first node, a source of the third switch transistor is connected to the first clock signal terminal, a drain of the third switch transistor is connected to the driving signal output terminal;

the capacitor is connected between the gate and the drain of the third switch transistor.

In an implementation, in the above shift register provided by embodiments of the present disclosure, the second output module comprises a fourth switch transistor; wherein a gate of the fourth switch transistor is connected to the second node, a source of the fourth switch transistor is connected to the driving signal output terminal, a drain of the fourth switch transistor is connected to the reference signal terminal.

In an implementation, in the above shift register provided by embodiments of the present disclosure, the second reset module comprises a fifth switch transistor; wherein a gate of the fifth switch transistor is connected to the second reset control signal terminal, a source of the fifth switch transistor is connected to the driving signal output terminal, a drain of the fifth switch transistor is connected to the reference signal terminal.

In an implementation, in the above shift register provided by embodiments of the present disclosure, the pull-down driving module comprises a sixth switch transistor, a seventh switch transistor, an eighth switch transistor, a ninth switch transistor and a tenth switch transistor; wherein a gate and a source of the sixth switch transistor are both connected to the node control signal terminal, a drain of the sixth switch transistor is connected to a gate of the seventh switch transistor and a source of the ninth switch transistor, respectively;

a source of the seventh switch transistor is connected to the node control signal terminal, a drain of the seventh switch transistor is connected to the second node;

a gate of the eighth switch transistor is connected to the second node, a source of the eighth switch transistor is connected to the first node, a drain of the eighth switch transistor is connected to the reference signal terminal;

a gate of the ninth switch transistor is connected to the first node, a drain of the ninth switch transistor is connected to the reference signal terminal;

a gate of the tenth switch transistor is connected to the first node, a source of the tenth switch transistor is connected to the second node, a drain of the tenth switch transistor is connected to the reference signal terminal.

Alternatively, in the above shift register provided by embodiments of the present disclosure, the pull-down driving module further comprises a fifth terminal connected to the input signal terminal, a sixth terminal connected to the driving signal output terminal, and a seventh terminal connected to a third clock signal terminal.

In an implementation, in the above shift register provided by embodiments of the present disclosure, the pull-down driving module comprises a sixth switch transistor, a seventh switch transistor, an eighth switch transistor, an eleventh switch transistor, a twelfth switch transistor, a thirteenth switch transistor, a fourteenth switch transistor and a fifteenth switch transistor; wherein a gate and a source of the sixth switch transistor are both connected to the node control signal terminal, a drain of the sixth switch transistor is connected to a gate of the seventh switch transistor, a source of the eleventh switch transistor and a source of the twelfth switch transistor, respectively;

a source of the seventh switch transistor is connected to the node control signal terminal, a drain of the seventh switch transistor is connected to the second node;

a gate of the eighth switch transistor is connected to the second node, a source of the eighth switch transistor is connected to the first node, a drain of the eighth switch transistor is connected to the reference signal terminal;

a gate of the eleventh switch transistor is connected to the driving signal output terminal, a drain of the eleventh switch transistor is connected to the reference signal terminal;

a gate of the twelfth switch transistor is connected to the input signal terminal and a drain of the twelfth switch transistor is connected to the reference signal terminal;

a gate of the thirteenth switch transistor is connected to the input signal terminal, a source of the thirteenth switch transistor is connected to the second node, a drain of the thirteenth switch transistor is connected to the reference signal terminal;

a gate of the fourteenth switch transistor is connected to the driving signal output terminal, a source of the fourteenth switch transistor is connected to the second node, a drain of the fourteenth switch transistor is connected to the reference signal terminal;

a gate of the fifteenth switch transistor is connected to the third clock signal terminal, a source of the fifteenth switch transistor is connected to the driving signal output terminal, a drain of the fifteenth switch transistor is connected to the reference signal terminal.

Alternatively, in the above shift register provided by embodiments of the present disclosure, the first reset control signal terminal and the second reset control signal terminal are a same signal terminal.

Alternatively, in the above shift register provided by embodiments of the present disclosure, a signal of the first reset control signal terminal is delayed more than zero less than one pulse width than a signal of the second reset control signal terminal.

Correspondingly, embodiments of the present disclosure provide a driving method of any of the shift registers described above, including an input phase, an output phase, a reset phase, and a reset hold phase; wherein at the reset hold phase, the pull-down driving module eliminates a noise on the first node resulting from change in the first clock signal under control of the node control signal terminal.

Alternatively, in the above driving method provided by embodiments of the present disclosure, the node control signal is a high-potential signal at least when the first clock signal is at a rising edge when the effective pulse signal of the input signal terminal is a high-potential signal.

Alternatively, in the above driving method provided by embodiments of the present disclosure, the node control signal is a low-potential signal at least when the first clock signal is at a falling edge when the effective pulse signal of the input signal terminal is a low-potential signal.

Correspondingly, embodiments of the present disclosure provide a gate driving circuit comprising a plurality of cascaded shift registers provided by embodiments of the present disclosure; wherein except for a first-stage shift register, a driving signal output terminal of a shift register of the $m^{th}$ stage is connected to a first reset control signal terminal and a second reset control signal terminal of a shift register of the $(m-1)^{th}$ stage, $m=2, 3, 4 \ldots$;

except for a last-stage shift register, a driving signal output terminal of a shift register of the $k^{th}$ stage is connected to an input signal terminal of a shift register of the $(k+1)^{th}$ stage, $k=1, 2, 3 \ldots$;

an input signal terminal of the first-stage shift register is connected to a frame start signal terminal.

Alternatively, in the above gate driving circuit provided by embodiments of the present disclosure, except for the first-stage shift register, a shift register of each of the remaining stages further comprises a frame initialization module; wherein an input terminal of the frame initialization module is connected to the frame start signal terminal, an output terminal of the frame initialization module is connected to the second node;

the frame initialization module is configured to initialize the driving signal output terminal of the shift register under the control of the frame start signal terminal.

Alternatively, in the above gate driving circuit provided by embodiments of the present disclosure, the frame initialization module comprises a sixteenth switch transistor, wherein a gate and a source of the sixteenth switch transistor are both connected to the frame start signal terminal, a drain of the sixteenth switch transistor is connected to the second node.

Correspondingly, embodiments of the present disclosure provide a gate driving circuit comprising a plurality of cascaded shift registers provided by embodiments of the present disclosure; wherein, except for a first-stage shift register and a second-stage shift register, a driving signal output terminal of a shift register of the $h^{th}$ stage is connected to a second reset control signal terminal of a shift register of the $(h-2)^{th}$ stage, $h=3, 4, 5 \ldots$;

except for the first-stage shift register, a second reset control signal terminal of a shift register of the $m^{th}$ stage is connected to a first reset control signal terminal of a shift register of the $(m-1)^{th}$ stage, $m=2, 3, 4 \ldots$;

except for shift registers of the last two stages, a driving signal output terminal of a shift register of the $j^{th}$ stage is connected to an input signal terminal of a shift register of the $(j+2)^{th}$ stage, $j=1, 2, 3 \ldots$;

input signal terminals of the first-stage shift register and the second-stage shift register are connected to a frame start signal terminal.

Alternatively, in the above gate driving circuit provided by embodiments of the present disclosure, except for the first-stage shift register, a shift register of each of the remaining stages further comprises a frame initialization module; wherein an input terminal of the frame initialization module is connected to the frame start signal terminal, an output terminal of the frame initialization module is connected to the second node;

the frame initialization module is configured to initialize the driving signal output terminal of the shift register under the control of the frame start signal terminal.

Alternatively, in the above gate driving circuit provided by embodiments of the present disclosure, the frame initialization module comprises a sixteenth switch transistor, wherein a gate and a source of the sixteenth switch transistor are both connected to the frame start signal terminal, a drain of the sixteenth switch transistor is connected to the second node.

Correspondingly, embodiments of the present disclosure further provide a display device comprising any gate driving circuit provided by embodiments of the present disclosure.

Embodiments of the present disclosure provide a shift register, a driving method thereof, a gate driving circuit and a display device. The shift register comprises an input module, a first reset module, a second reset module, a pull-down driving module, a first output module and a second output module, wherein the input module is configured to control the potential of the first node under the control of the input signal terminal, the first reset module is configured to provide the reference signal of the reference signal terminal to the first node under the control of the first reset control signal terminal, the second reset module is configured to provide the reference signal to the driving signal output terminal under the control of the second reset control signal terminal, the first output module is configured to provide the first clock signal of the first clock signal terminal to the driving signal output terminal under the control of the first node, the second output module is configured to provide the reference signal to the driving signal output terminal under the control of the second node, and the pull-down driving module is configured to control the potential of the second node to be a second potential when the potential of the first node is a first potential, control the potential of the first node to be the second potential when the potential of the second node is the first potential, and control the potential of the second node to be the first potential when the potential of the node control signal terminal is the first potential and the potential of the first node is the second potential. Since the node control signal at the node control signal terminal can eliminate the noise on the first node resulting from the change in the first clock signal, the output stability of the shift register can be improved.

DETAILED DESCRIPTION

Specific implementations of the shift register, the driving method thereof, the gate driving circuit and the display device provided by embodiments of the present disclosure will be described in detail below with reference to the drawings.

Figure 1A:
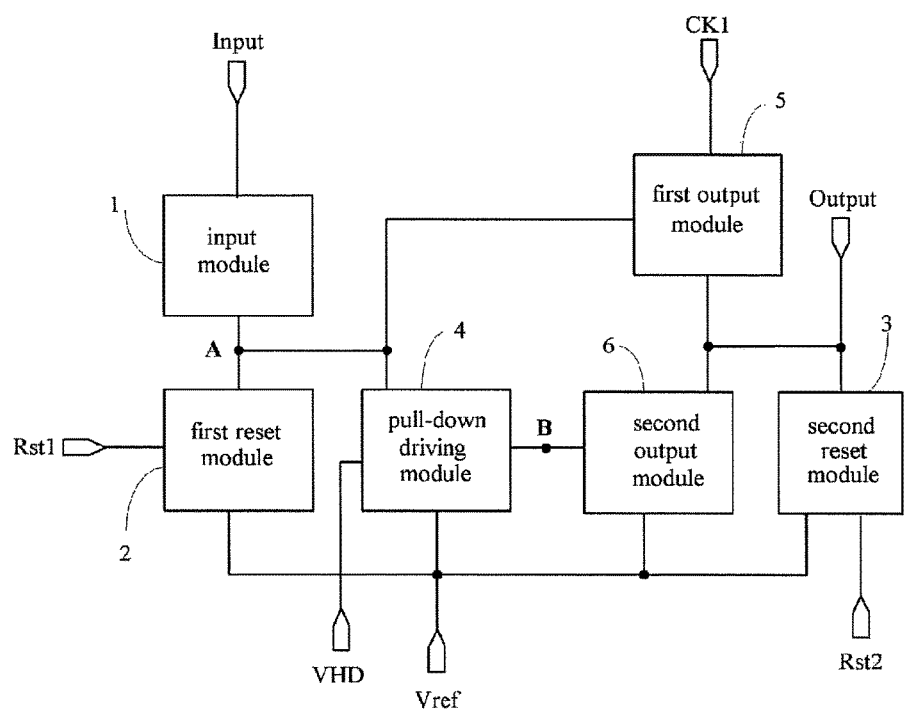
FIG. 1a is a schematic structural diagram of a shift register provided by an embodiment of the present disclosure.

A shift register provided by embodiments of the present disclosure comprises, as shown in FIG. 1a, an input module 1, a first reset module 2, a second reset module 3, a pull-down driving module 4, a first output module 5 and a second output module 6; wherein the first terminal of the input module 1 is connected to an input signal terminal Input and the second terminal of the input module 1 is connected to a first node A; the input module 1 is configured to control the potential of the first node A under the control of the input signal terminal Input;

the first terminal of the first reset module 2 is connected to a reference signal terminal Vref, the second terminal of the first reset module 2 is connected to a first reset control signal terminal Rst1 and the third terminal of the first reset module 2 is connected to the first node A; the first reset module 2 is configured to provide a reference signal of the reference signal terminal Vref to the first node A under the control of the first reset control signal terminal Rst1;

the first terminal of the second reset module 3 is connected to a second reset control signal terminal Rst2, the second terminal of the second reset module 3 is connected to the reference signal terminal Vref, the third terminal of the second reset module 3 is connected to a driving signal output terminal Output; the second reset module 3 is configured to provide the reference signal to the driving signal output terminal Output under the control of the second reset control signal terminal Rst2;

the first terminal of the first output module 5 is connected to a first clock signal terminal CK1, a second terminal of the first output module 5 is connected to the first node A and the third terminal of the first output module 5 is connected to the driving signal output terminal Output; the first output module 5 is configured to provide a first clock signal of the first clock signal terminal CK1 to the driving signal output terminal Output under the control of the first node A;

the first terminal of the second output module 6 is connected to the reference signal terminal Vref, the second terminal of the second output module 6 is connected to a second node B, and the third terminal of the second output module 6 is connected to the driving signal output terminal Output; the second output module 6 is configured to provide the reference signal to the driving signal output terminal Output under the control of the second node B;

the first terminal of the pull-down driving module 4 is connected to a node control signal terminal VHD, the second terminal of the pull-down driving module 4 is connected to the reference signal terminal Vref, the third terminal of the pull-down driving module 4 is connected to the first node A, the fourth terminal of the pull-down driving module 4 is connected to the second node B; the pull-down driving module 4 is configured to control the potential of the second node B to be a second potential when the potential of the first node A is a first potential, and control the potential of the first node A to be the second potential when the potential of the second node B is the first potential, when the effective pulse signal of the input signal terminal Input is a high-potential signal, the first potential is a high potential and the second potential is a low potential; when the effective pulse signal of the input signal terminal Input is a low-potential signal, the first potential is a low potential and the second potential is a high potential; the node control signal of the node control signal terminal VHD is configured to eliminate a noise on the first node resulting from the change in the first clock signal.

The above shift register provided by embodiments of the present disclosure comprises an input module, a first reset module, a second reset module, a pull-down driving module, a first output module and a second output module, wherein the input module is configured to control the potential of the first node under the control of the input signal terminal; the first reset module is configured to provide the reference signal of the reference signal terminal to the first node under the control of the first reset control signal terminal to reset the first node; the second reset module is configured to provide the reference signal to the driving signal output terminal under the control of the second reset control signal terminal to reset the driving signal output terminal; the first output module is configured to provide the first clock signal of the first clock signal terminal to the driving signal output terminal under the control of the first node; the second output module is configured to provide the reference signal to the driving signal output terminal under the control of the second node; the pull-down driving module is configured to control the potential of the second node to be a second potential when the potential of the first node is a first potential, control the potential of the first node to be the second potential when the potential of the second node is the first potential, and control the potential of the second node to be the first potential when the potential of the node control signal terminal is a first potential and the potential of the first node is a second potential. Since the node control signal of the node control signal terminal can eliminate the noise on the first node resulting from the change in the first clock signal, the output stability of the shift register can be improved.

Upon implementation, in the above shift register provided by embodiments of the present disclosure, when the effective pulse signal of the input signal terminal is a high-potential signal, the node control signal is a high-potential signal at least when the first clock signal is at a rising edge. Accordingly, it can be ensured that the potential of the second node is controlled to be a high potential when the first clock signal is at a rising edge and the potential of the first node is a low potential, such that the second output module provides the reference signal to the driving signal output terminal under the control of the second node, thereby eliminating the noise generated by coupling at the first node and the driving signal output terminal when the first clock signal is at a rising edge.

Upon implementation, in the above shift register provided by embodiments of the present disclosure, when the effective pulse signal of the input signal terminal is a low potential signal, the node control signal is a low-potential signal at least when the first clock signal is at a falling edge. Accordingly, it can be ensured that the potential of the second node is controlled to be a low potential when the first clock signal is at a falling edge and the potential of the first node is a high potential, such that the second output module provides the reference signal to the driving signal output terminal under the control of the second node, thereby eliminating the noise generated by coupling at the first node and the driving signal output terminal when the first clock signal is at a falling edge.

Upon implementation, in the above shift register provided by embodiments of the present disclosure, the node control signal may be an AC signal or a DC signal, which is not limited here.

Alternatively, in the above shift register provided by embodiments of the present disclosure, the node control signal is an AC signal which is a second clock signal. This can reduce the bias effect of the pull-down driving module, thereby extending the lifetime of the pull-down driving module.

Alternatively, upon implementation, in the above shift register provided by embodiments of the present disclosure, when the node control signal is the second clock signal, the time for the node control signal being a high-potential signal (when the effective pulse signal of the input signal terminal is a high-potential signal) or a low-potential signal (when the effective pulse signal of the input signal terminal is a low-potential signal) in each cycle is controlled to be more than 0.5 us.

Further, in the above shift register provided by embodiments of the present disclosure, the duty cycle of the second clock signal is controlled to be between 2% and 50%. This can further reduce the bias effect of the pull-down driving module, thereby extending the lifetime of the pull-down driving module.

Further, upon implementation, in the above shift register provided by embodiments of the present disclosure, the period width of the first clock signal is an integer multiple of the period width of the second clock signal, so that it can be ensured that the noise on the first node resulting from the change in the first clock signal is eliminated.

It is to be noted that in the above shift register provided by embodiments of the present disclosure, the reference signal of the reference signal terminal is at low potential when the effective pulse signal of the input signal terminal is a high-potential signal; the reference signal of the reference signal terminal is at high potential when the effective pulse signal of the input signal terminal is a low-potential signal.

Upon implementation, in the above shift register provided by embodiments of the present disclosure, the first reset control signal terminal and the second reset control signal terminal are the same signal terminal, that is, the first reset control signal of the first reset control signal terminal and the second reset control signal of the second reset control signal terminal are the same signal.

Or, upon implementation, in the above shift register provided by embodiments of the present disclosure, the signal of the first reset control signal terminal is delayed more than zero less than one pulse width than the signal of the second reset control signal terminal.

The present disclosure will be described in detail below with reference to the specific embodiments. It is to be noted that the present embodiments are intended to better set forth the present disclosure, but not to limit the present disclosure.

Upon implementation, in the above shift register provided by embodiments of the present disclosure, as shown in FIGS. 2a to 3b, the input module 1 comprises a first switch transistor T1; wherein the gate and the source of the first switch transistor T1 are both connected to the input signal terminal Input, and the drain of the first switch transistor T1 is connected to the first node A.

Figure 2A:
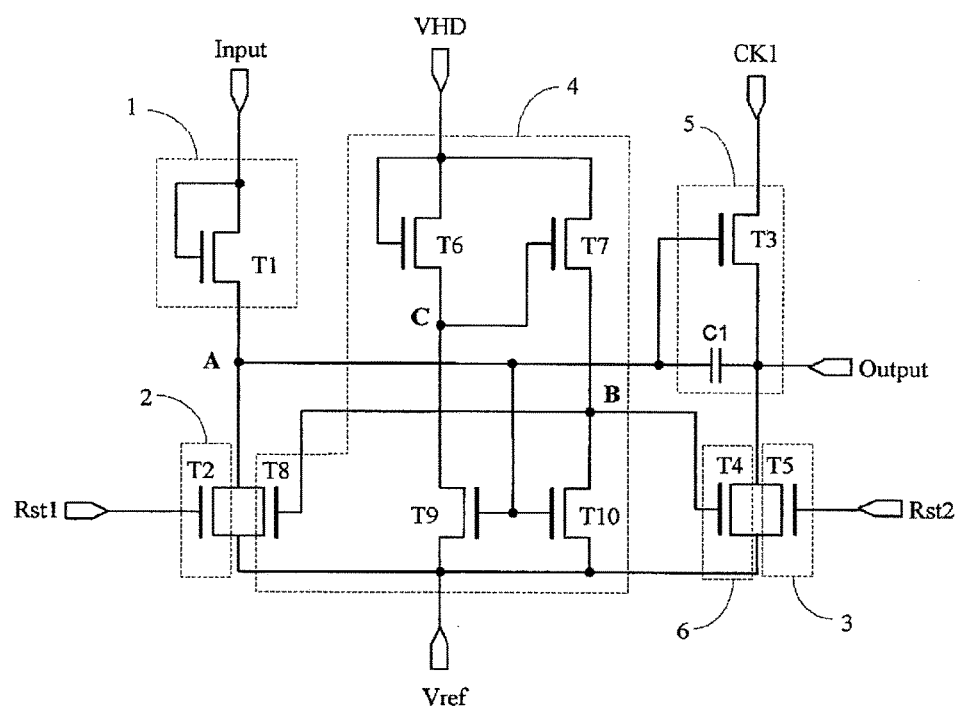
FIG. 2a is a schematic diagram of a specific structure of a shift register provided by an embodiment of the present disclosure.
Figure 2B:
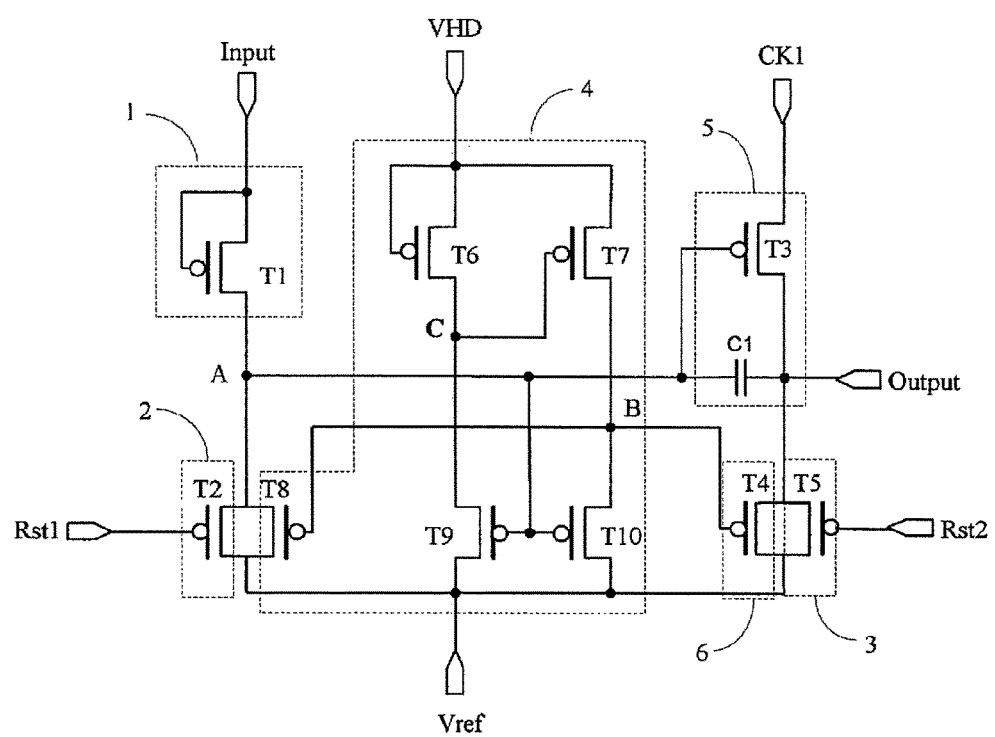
FIG. 2b is a schematic diagram of a specific structure of a shift register provided by another embodiment of the present disclosure.
Figure 3A:
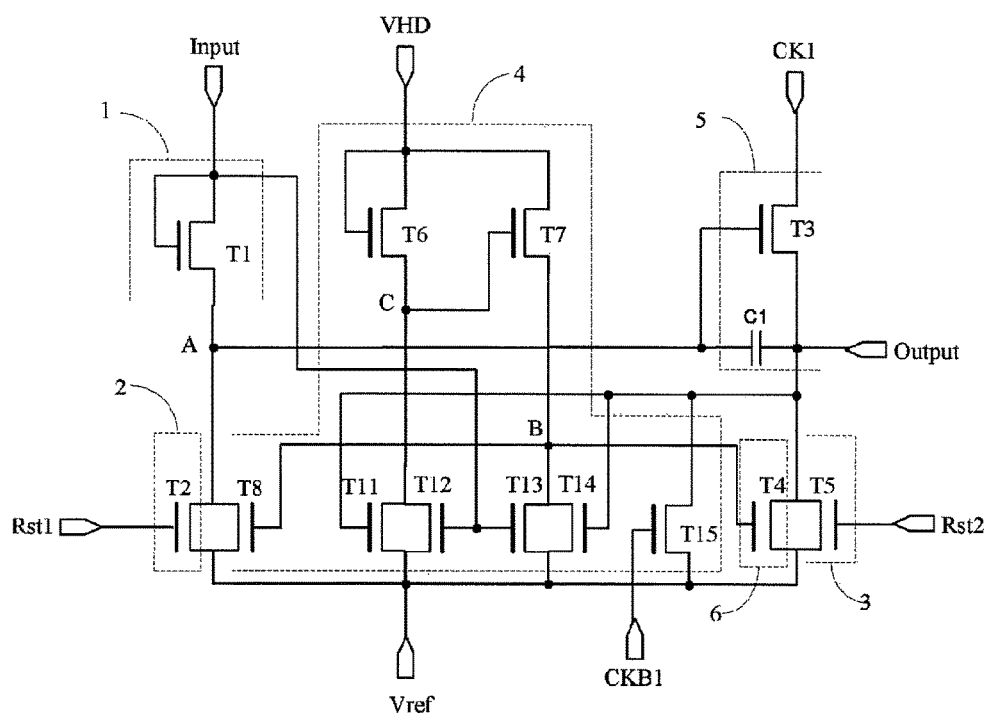
FIG. 3a is a schematic diagram of a specific structure of a shift register provided by a further embodiment of the present disclosure.
Figure 3B:
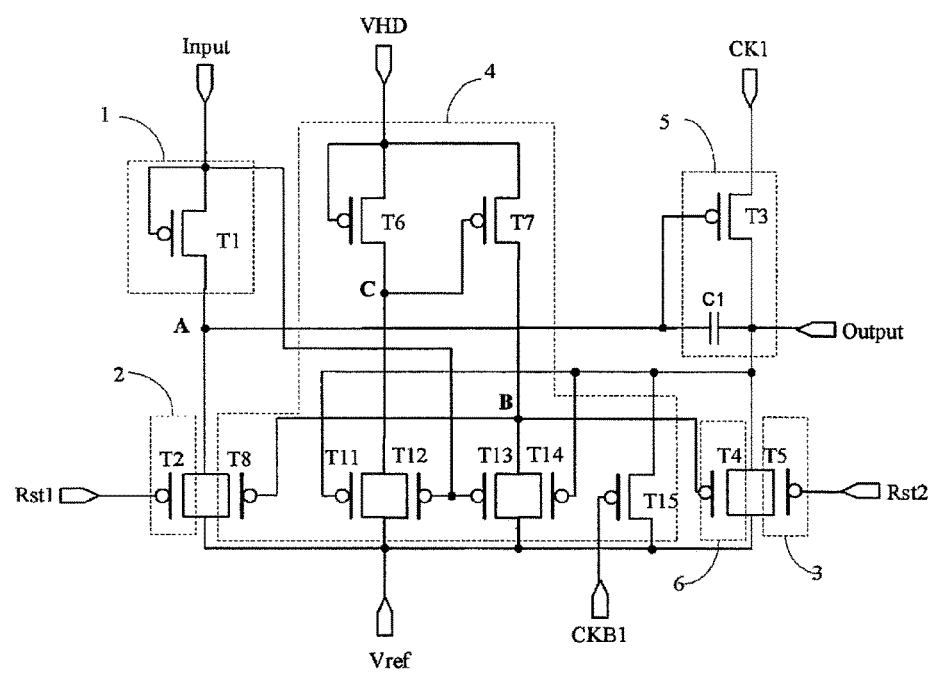
FIG. 3b is a schematic diagram of a specific structure of a shift register provided by yet another embodiment of the present disclosure.

Specifically, in the above shift register provided by embodiments of the present disclosure, the first transistor T1 may be an N-type transistor as shown in FIGS. 2a and 3a, or the first transistor T1 may also be a P-type transistor as shown in FIGS. 2b and 3b, which is not limited here.

The above specific structure of the input module in the shift register is just illustrative. Upon implementation, the specific structure of the input module is not limited to the above structure provided by embodiments of the present disclosure, and may also be other structures known to those skilled in the art, which is not limited here.

Upon implementation, in the above shift register provided by embodiments of the present disclosure, as shown in FIGS. 2a to 3b, the first reset module 2 comprises a second switch transistor T2; wherein the gate of the second switch transistor T2 is connected to the first reset control signal terminal Rst1, the source of the second switch transistor T2 is connected to the first node A and the drain of the second switch transistor T2 is connected to the reference signal terminal Vref.

Specifically, in the above shift register provided by embodiments of the present disclosure, the second switch transistor T2 may be an N-type transistor as shown in FIGS. 2a and 3a, or the second switch transistor T2 may also be a P-type transistor as shown in FIGS. 2b and 3b, which is not limited here.

The above specific structure of the first reset module in the shift register is just illustrative. Upon implementation, the specific structure of the first reset module is not limited to the above structure provided by embodiments of the present disclosure, and may also be other structures known to those skilled in the art, which is not limited here.

Upon implementation, in the above shift register provided by embodiments of the present disclosure, as shown in FIGS. 2a to 3b, the first output module 5 comprises a third switch transistor T3 and a capacitor C1; wherein the gate of the third switch transistor T3 is connected to the first node A, the source of the third switch transistor T3 is connected to the first clock signal terminal CK1, and the drain of the third switch transistor T3 is connected to the driving signal output terminal Output;

the capacitor C1 is connected between the gate and the drain of the third switch transistor T3.

Here, the capacitor C1 is to further pull up or pull down the potential of the first node A by means of the bootstrap effect of the capacitor C1 when the first node A is in floating state, thereby ensuring the output of the shift register to be correct.

Specifically, in the above shift register provided by embodiments of the present disclosure, the third switch transistor T3 may be an N-type transistor as shown in FIGS. 2a and 3a, or the third switch transistor T3 may also be a P-type transistor as shown in FIGS. 2b and 3b, which is not limited here.

The above specific structure of the first output module in the shift register is just illustrative. Upon implementation, the specific structure of the first output module is not limited to the above structure provided by embodiments of the present disclosure, and may also be other structures known to those skilled in the art, which is not limited here.

Upon implementation, in the above shift register provided by embodiments of the present disclosure, as shown in FIGS. 2a to 3b, the second output module 6 comprises a fourth switch transistor T4; wherein the gate of the fourth switch transistor T4 is connected to the second node B, the drain of the fourth switch transistor T4 is connected to the reference signal terminal Vref, and the source of the fourth switch transistor T4 is connected to the driving signal output terminal Output.

Specifically, in the above shift register provided by embodiments of the present disclosure, the fourth switch transistor T4 may be an N-type transistor as shown in FIGS. 2a and 3a, or the fourth switch transistor T4 may also be a P-type transistor as shown in FIGS. 2b and 3b, which is not limited here.

The above specific structure of the second output module in the shift register is just illustrative. Upon implementation, the specific structure of the second output module is not limited to the above structure provided by embodiments of the present disclosure, and may also be other structures known to those skilled in the art, which is not limited here.

Upon implementation, in the above shift register provided by embodiments of the present disclosure, as shown in FIGS. 2a to 3b, the second reset module 3 comprises a fifth switch transistor T5; wherein the gate of the fifth switch transistor T5 is connected to the second reset control signal terminal Rst2, the drain of the fifth switch transistor T5 is connected to the reference signal terminal Vref, and the source of the fifth switch transistor T5 is connected to the driving signal output terminal Output.

Specifically, in the above shift register provided by embodiments of the present disclosure, the fifth switch transistor T5 may be an N-type transistor as shown in FIGS. 2a and 3a, or the fifth switch transistor T5 may also be a P-type transistor as shown in FIGS. 2b and 3b, which is not limited here.

The above specific structure of the second reset module in the shift register is just illustrative. Upon implementation, the specific structure of the second reset module is not limited to the above structure provided by embodiments of the present disclosure, and may also be other structures known to those skilled in the art, which is not limited here.

Upon implementation, in the above shift register provided by embodiments of the present disclosure, as shown in FIGS. 2a and 2b, the pull-down driving module 4 comprises a sixth switch transistor T6, a seventh switch transistor T7, an eighth switch transistor T8, a ninth switch transistor T9 and a tenth switch transistor T10; wherein the gate and the source of the sixth switch transistor T6 are both connected to the node control signal terminal VHD and the drain of the sixth switch transistor T6 is connected to the gate of the seventh switch transistor T7 and the source of the ninth switch transistor T9, the source of the seventh switch transistor T7 is connected to the node control signal terminal VHD and the drain of the seventh switch transistor T7 is connected to the second node B;

the gate of the eighth switch transistor T8 is connected to the second node B, the source of the eighth switch transistor T8 is connected to the first node A, and the drain of the eighth switch transistor T8 is connected to the reference signal terminal Vref;

the gate of the ninth switch transistor T9 is connected to the first node A and the drain of the ninth switch transistor T9 is connected to the reference signal terminal Vref;

the gate of the tenth switch transistor T10 is connected to the first node A, the source of the tenth switch transistor T10 is connected to the second node B, and the drain of the tenth switch transistor T10 is connected to the reference signal terminal Vref.

Specifically, in the above shift register provided by embodiments of the present disclosure, the sixth switch transistor T6, the seventh switch transistor T7, the eighth switch transistor T8, the ninth switch transistor T9 and the tenth switch transistor T10 may be N-type transistors as shown in FIG. 2a, or the sixth switch transistor T6, the seventh switch transistor T7, the eighth switch transistor T8, the ninth switch transistor T9 and the tenth switch transistor T10 may be P-type transistors as shown in FIG. 2b, which are not limited here.

Figure 1B:
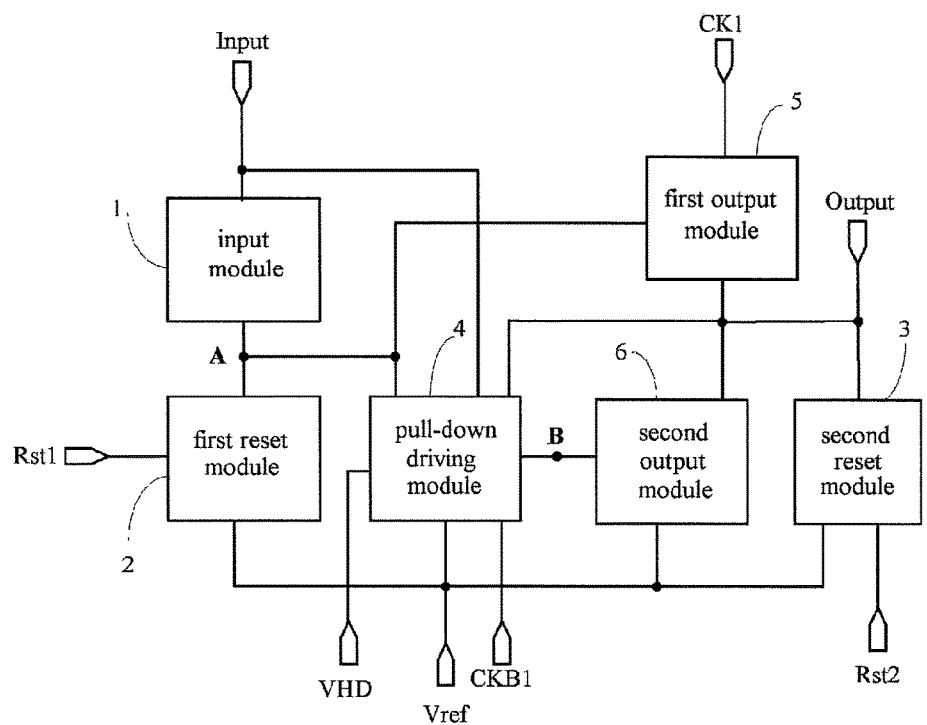
FIG. 1b is a schematic structural diagram of a shift register provided by another embodiment of the present disclosure.

Upon implementation, in the above shift register provided by embodiments of the present disclosure, as shown in FIG. 1b, the pull-down driving module 4 further comprises a fifth terminal connected to the input signal terminal Input, a sixth terminal connected to the driving signal output terminal Output, and a seventh terminal connected to a third clock signal terminal CKB1.

Upon implementation, in the above shift register provided by embodiments of the present disclosure, as shown in FIGS. 3a and 3b, the pull-down driving module 4 comprises a sixth switch transistor T6, a seventh switch transistor T7, an eighth switch transistor T8, an eleventh switch transistor T11, a twelfth switch transistor T12, a thirteenth switch transistor T13, a fourteenth switch transistor T14 and a fifteenth switch transistor T15; wherein the gate and the source of the sixth switch transistor T6 are both connected to the node control signal terminal VHD, and the drain of the sixth switch transistor T6 is connected to the gate of the seventh switch transistor T7, the source of the eleventh switch transistor T11 and the source of the twelfth switch transistor T12, respectively;

the source of the seventh switch transistor T7 is connected to the node control signal terminal VHD and the drain of the seventh switch transistor T7 is connected to the second node B;

the gate of the eighth switch transistor T8 is connected to the second node B, the source of the eighth switch transistor T8 is connected to the first node A, and the drain of the eighth switch transistor T8 is connected to the reference signal terminal Vref;

the gate of the eleventh switch transistor T11 is connected to the driving signal output terminal Output and the drain of the eleventh switch transistor T11 electrode is connected to the reference signal terminal Vref;

the gate of the twelfth switch transistor T12 is connected to the input signal terminal Input and the drain of the twelfth switch transistor T12 is connected to the reference signal terminal Vref;

the gate of the thirteenth switch transistor T13 is connected to the input signal terminal Input, the source of the thirteenth switch transistor T13 is connected to the second node B, and the drain of the thirteenth switch transistor T13 is connected to the reference signal terminal Vref;

the gate of the fourteenth switch transistor T14 is connected to the driving signal output terminal Output, the source of the fourteenth switch transistor T14 is connected to the second node B, and the drain of the fourteenth switch transistor T14 is connected to the reference signal terminal Vref;

the gate of the fifteenth switch transistor T15 is connected to the third clock signal terminal CKB1, the source of the fifteenth switch transistor T15 is connected to the driving signal output terminal Output and the drain of the fifteenth switch transistor T15 is connected to the reference signal terminal Vref; wherein the third clock signal of the third clock signal terminal CKB1 has a phase opposite to that of the first clock signal.

Specifically, in the above shift register provided by embodiments of the present disclosure, the sixth switch transistor T6, the seventh switch transistor T7, the eighth switch transistor T8, the eleventh switch transistor T11, the twelfth switch transistor T12, the thirteenth switch transistor T13, the fourteenth switch transistor T14 and the fifteenth switch transistor T15 may be N-type transistors as shown in FIG. 3a, or the sixth switch transistor T6, the seventh switch transistor T7, the eighth switch transistor T8, the eleventh switch transistor T11, the twelfth switch transistor T12, the thirteenth switch transistor T13, the fourteenth switch transistor T14 and the fifteenth switch transistor T15 may be P-type transistors as shown in FIG. 3b, which are not limited here.

The above specific structure of the pull-down driving module in the shift register is just illustrative. Upon implementation, the specific structure of the pull-down driving module is not limited to the above structure provided by embodiments of the present disclosure, and may also be other structures known to those skilled in the art, which is not limited here.

In the above shift register provided by embodiments of the present invention, the switch transistors generally all employ transistors of the same material. Upon implementation, in order to simplify the manufacturing process, the first to fifteenth switch transistors described above all employ P-type transistors or N-type transistors.

When the effective pulse signal of the input signal terminal is a high-potential signal, the first to the fifteenth switch transistors are all N-type transistors; when the effective pulse signal of the input signal terminal is a low-potential signal, the first to the fifteenth switch transistors are all P-type transistors.

It is to be noted that the switch transistor mentioned in the above embodiments of the present disclosure may be a thin film transistor (TFT) or a metal oxide semiconductor (MOS) field effect transistor, which is not limited here. During implementation, the functions of the sources and the drains of these switch transistors can be interchanged according to different types of transistor and input signals, which are not differentiated here.

The working process of the shift register according to embodiments of the present disclosure will be described below by taking an N-type transistor as an example. In the description below, a high potential is represented by 1 and a low potential is represented by 0.

Figure 4A:
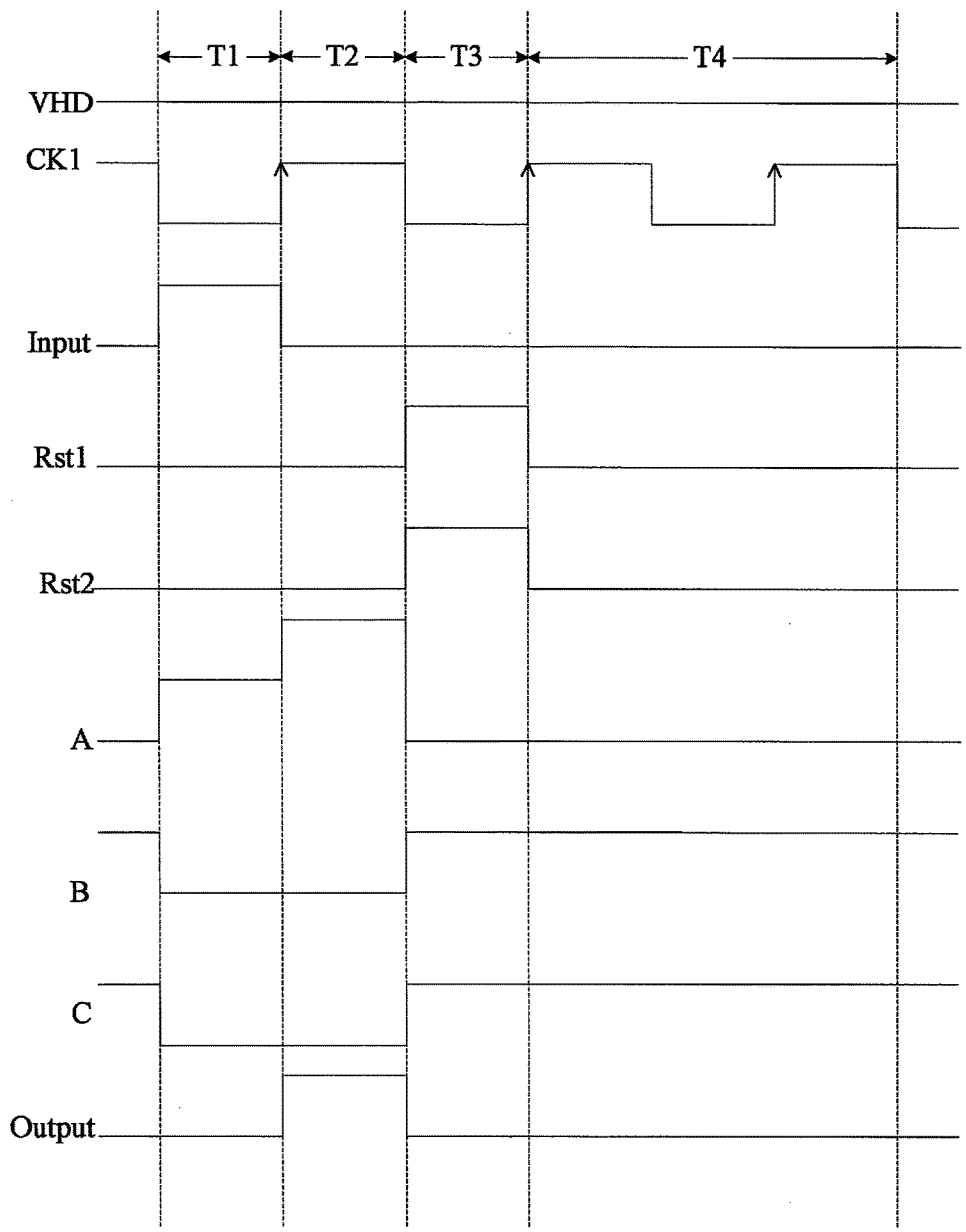
FIG. 4a is a circuit timing diagram of a shift register provided by an embodiment of the present disclosure.
Figure 4B:
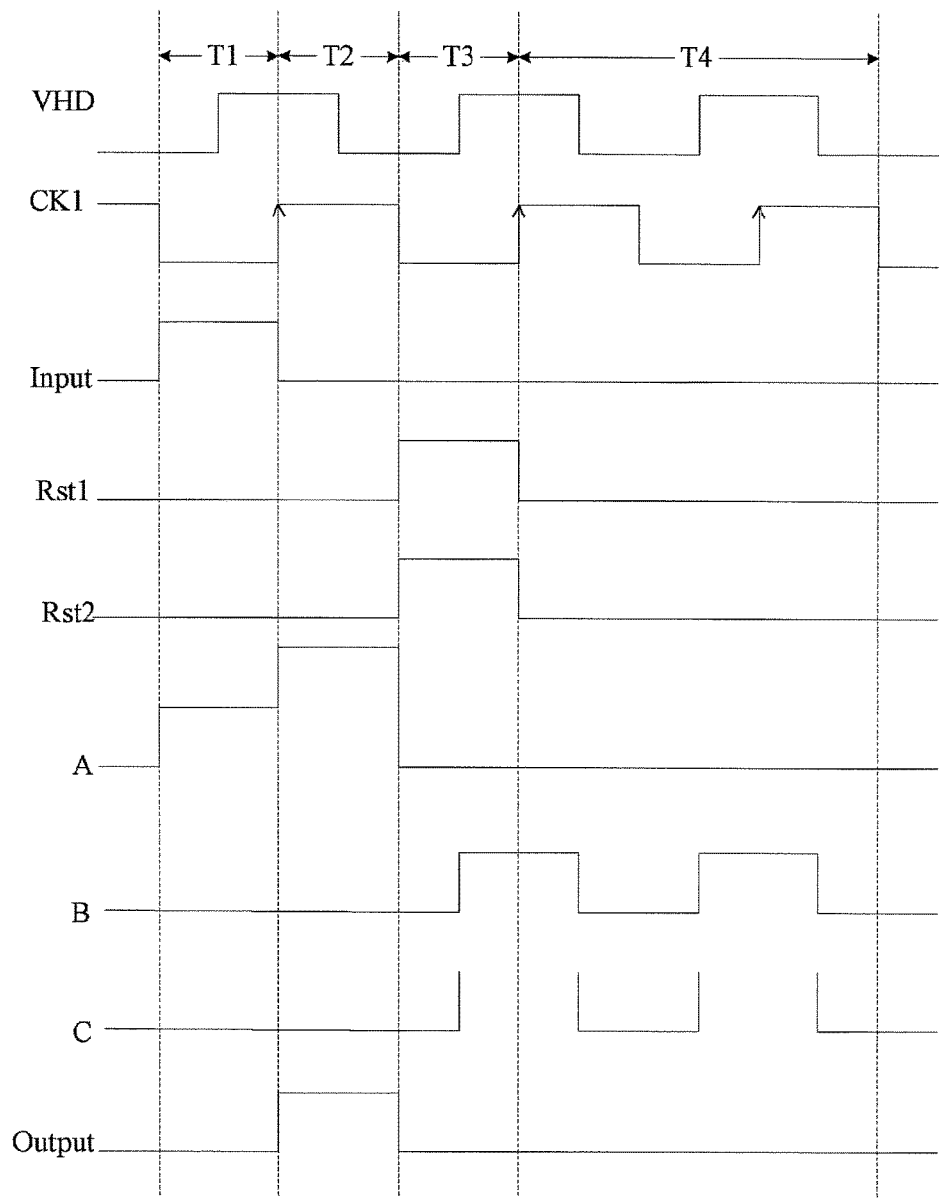
FIG. 4b is a circuit timing diagram of a shift register provided by an embodiment of the present disclosure.
Figure 4C:
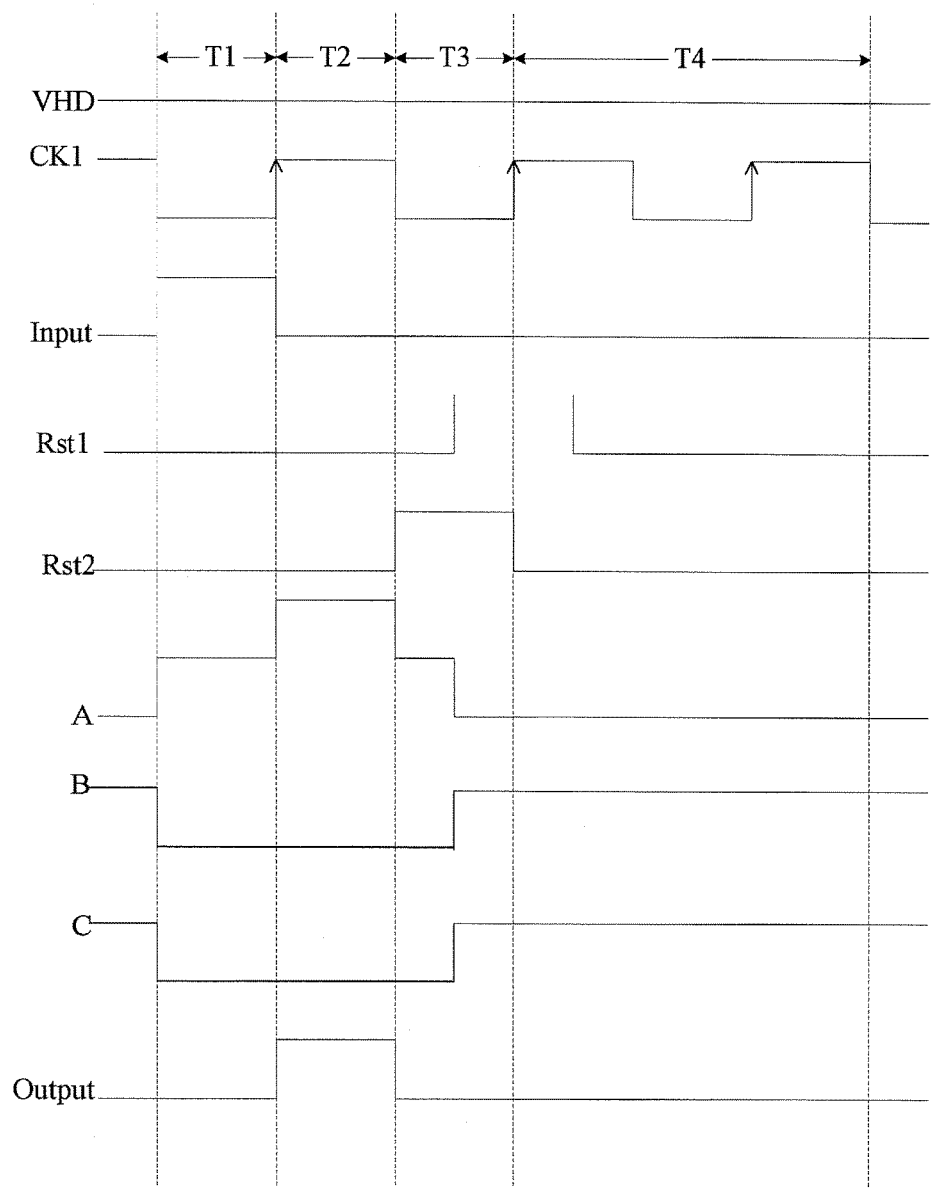
FIG. 4c is a circuit timing diagram of a shift register provided by an embodiment of the present disclosure.
Figure 4D:
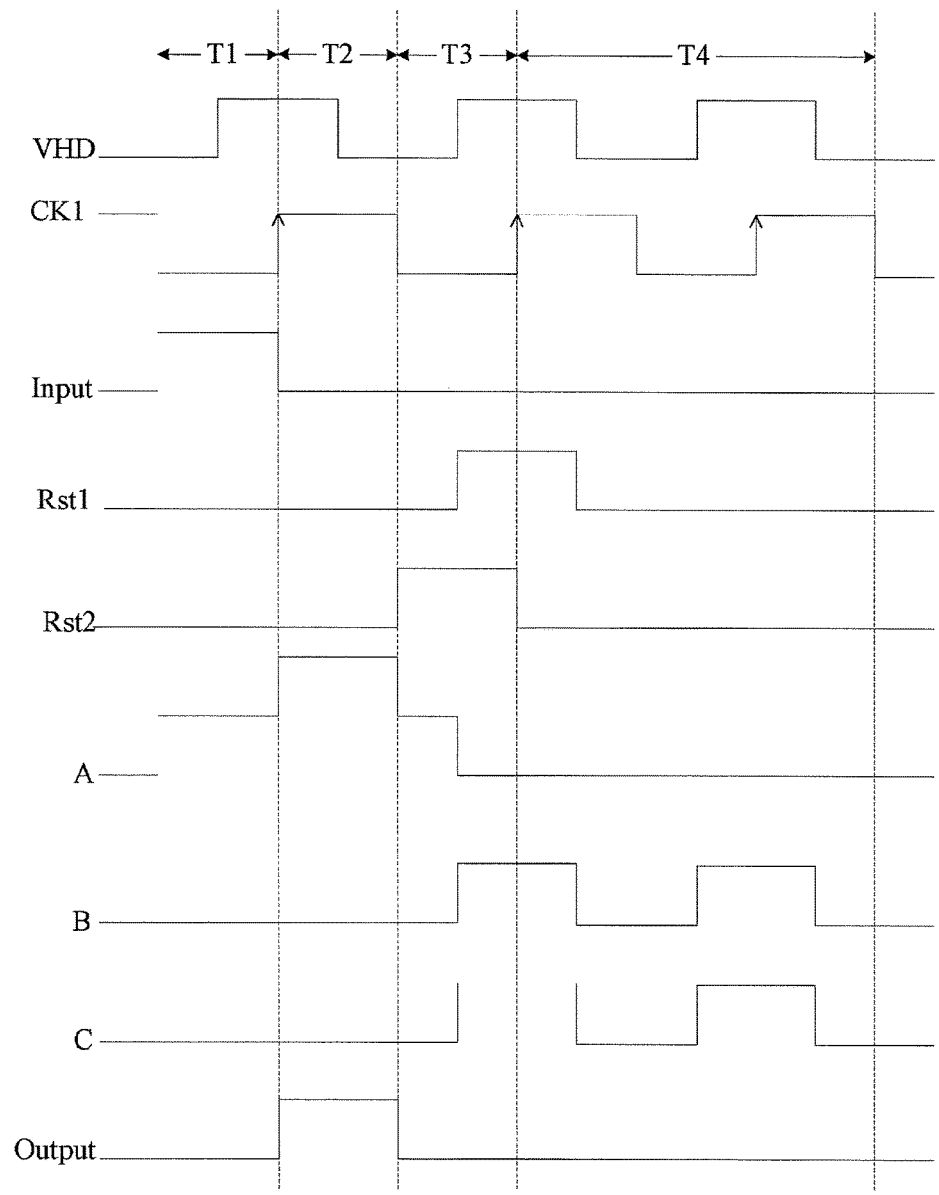
FIG. 4d is a circuit timing diagram of a shift register provided by an embodiment of the present disclosure.
Figure 5A:
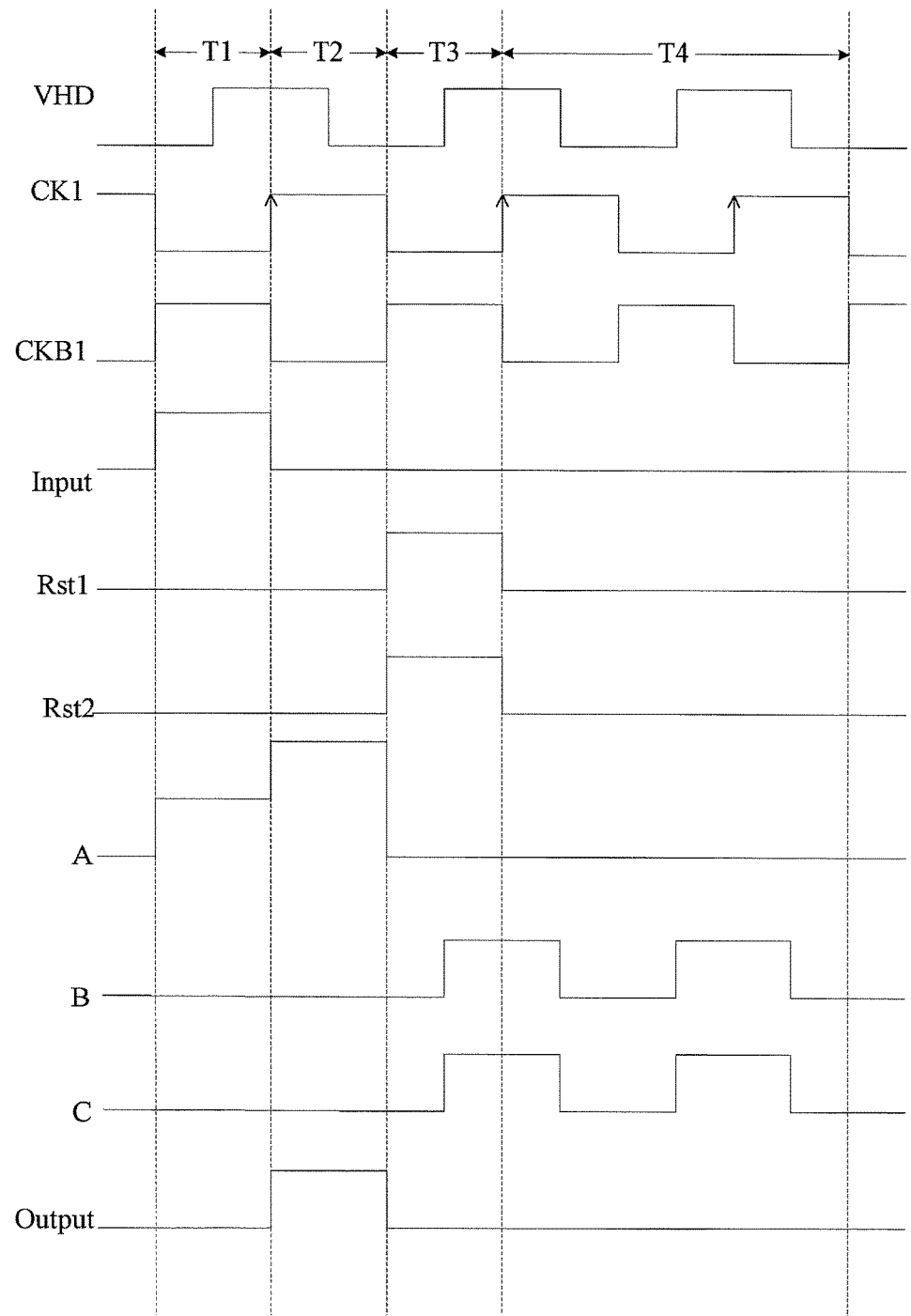
FIG. 5a is a circuit timing diagram of a shift register provided by an embodiment of the present disclosure.
Figure 5B:
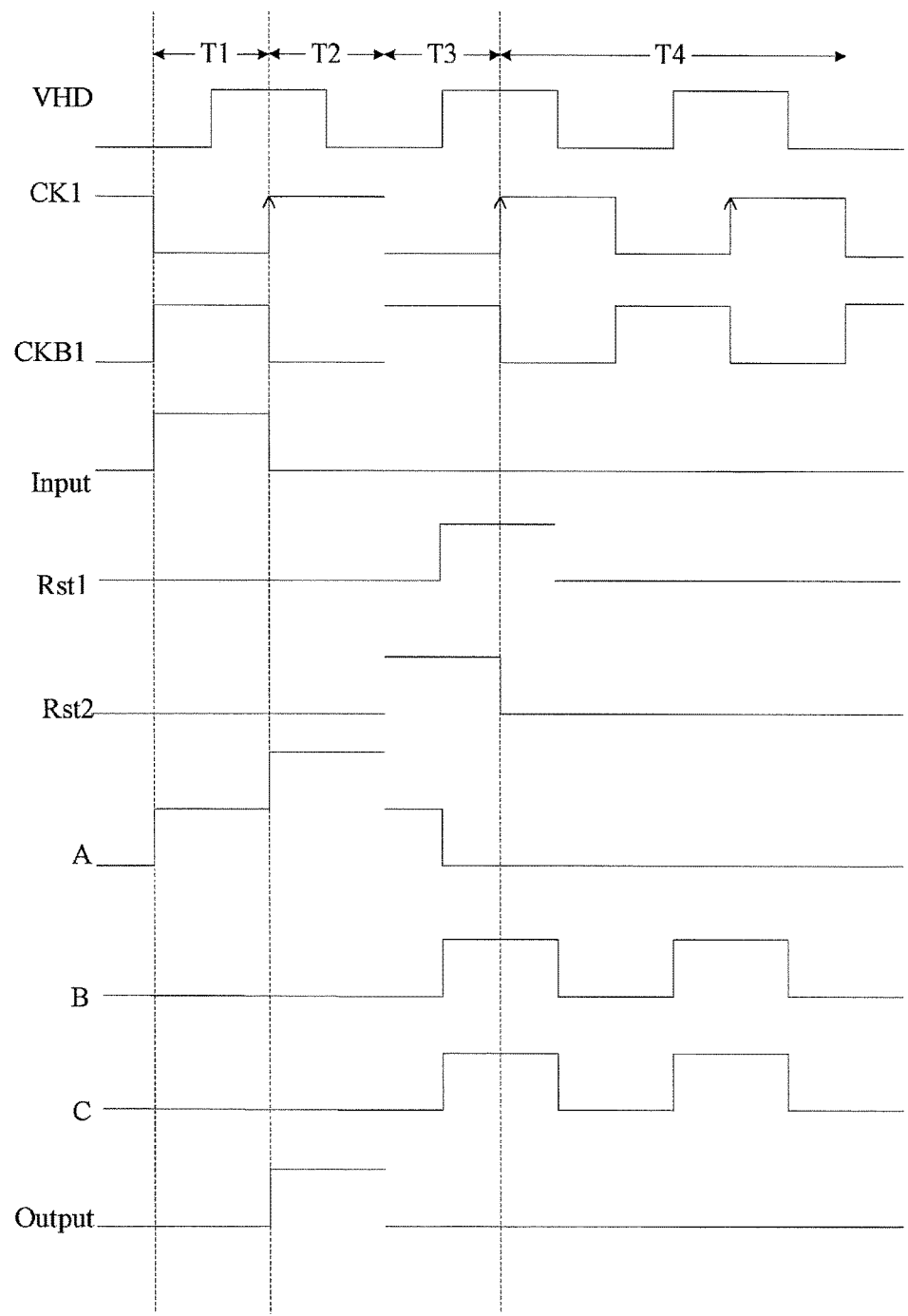
FIG. 5b is a circuit timing diagram of a shift register provided by an embodiment of the present disclosure.

Specifically, embodiments shown in FIGS. 4a, 4b, 4c, 4d describe the working process of the shift register by taking the structure of the shift register shown in FIG. 2a as an example, and embodiments shown in FIGS. 5a and 5b describe the working process of the shift register by taking the structure of the shift register shown in FIG. 3a as an example. For the convenience of description, the gate of the seventh switch transistor T7 is taken as a third node C, wherein in the shift registers shown in FIGS. 2a and 3a, all the switch transistors are N-type transistors, and respective N-type transistors are turned on under the effect of the high potential and cut off under the effect of the low potential; the effective pulse signal of the input signal terminal Input is a high-potential signal, and the reference signal of the reference signal terminal Vref is a low-potential signal.

In an embodiment, the first reset control signal terminal Rst1 and the second reset control signal terminal Rst2 are the same signal terminal, the node control signal of the node control signal terminal VHD is a DC signal, and the corresponding input-output timing diagram is as shown in FIG. 4a. Specifically, four phases T1, T2, T3, and T4 in the input-output timing diagram as shown in FIG. 4a are selected.

In the first phase T1, Input=1, Rst1=Rst2=0, CK1=0, VHD=1.

In the phase T1, the second switch transistor T2 and the fifth switch transistor T5 are cutoff since the Rst1 and Rst2 are at low potential. The first switch transistor T1 is turned on since Input is at high potential. The sixth switch transistor T6 is turned on since VHD is at high potential. The node control signal is transmitted to the third node C through the sixth switch transistor T6, and the input signal of Input is transmitted to the first node A through the first switch transistor T1. The potential of the first node A is a high potential, the capacitor C1 is in charge state, and the third switch transistor T3, the ninth switch transistor T9 and the tenth switch transistor T10 are turned on. The reference signal is transmitted to the third node C through the ninth switch transistor T9. Due to the setting of width to length ratios of the sixth switch transistor T6 and the ninth switch transistor T9, the potential of the point C is a low potential, thus the seventh switch transistor T7 is cut off. The reference signal is transmitted to the second node B through the tenth switch transistor T10 and the potential of the second node B is a low potential, thus the fourth switch transistor T4 and the eighth switch transistor T8 are cut off. The first clock signal is transmitted to the driving signal output terminal Output through the third switch transistor T3. The potential of the driving signal output terminal Output is a low potential.

In the second phase T2, Input=0, Rst1=Rst2=0, CK1=1 and VHD=1.

In the phase T2, the second switch transistor T2 and the fifth switch transistor T5 remain cut off because the Rst1 and Rst2 remain at low potential. The first switch transistor T1 becomes to be cut off because the potential of the Input becomes a low potential. The sixth switch transistor T6 remains turned on because the VHD remains at high potential. The node control signal is transmitted to the third node C through the sixth switch transistor T6. Since the potential of the CK1 becomes a high potential, the potential of the first node A is further pulled up due to the bootstrap effect of the capacitor C1, the third switch transistor T3, the ninth switch transistor T9 and the tenth switch transistor T10 remain turned on, and the reference signal is transmitted to the third node C through the ninth switch transistor T9. The potential of the point C is a low potential due to the setting of the width to length ratios of the sixth switch transistor T6 and the ninth switch transistor T9, thus the seventh switch transistor T7 remains cut off. The reference signal is transmitted to the second node B through the tenth switch transistor T10 and the potential of the second node B remains low, thus the fourth switch transistor T4 and the eighth switch transistor T8 remain cut off. The first clock signal is transmitted to the driving signal output terminal Output through the third switch transistor T3, and the potential of the driving signal output terminal Output becomes a high potential.

In the third phase T3, Input=0, Rst1=Rst2=1, CK1=0, VHD=1.

In the phase T3, the second switch transistor T2 and the fifth switch transistor T5 become turned on because the potentials of the Rst1 and Rst2 become high potentials. The first switch transistor T1 remains cut off because the Input remains at low potential. The sixth switch transistor T6 remains turned on because the VHD remains at high potential. The reference signal is transmitted to the first node A through the second switch transistor T2, the potential of the first node A becomes a low potential, the capacitor C1 is in discharge state, and the third switch transistor T3, the ninth switch transistor T9 and the tenth switch transistor T10 become to be cut off. The node control signal is transmitted to the third node C through the sixth switch transistor T6, the potential of the third node C becomes a high potential, the seventh switch transistor T7 becomes turned on, and the potential of the second node B becomes a high potential. The second node B controls the eighth switch transistor T8 and the fourth switch transistor to become turned on, the reference signal is transmitted to the first node A through the eighth switch transistor T8 to further ensure that the potential of the first node A is a low potential, the reference signal is transmitted to the driving signal output terminal Output through the fourth switch transistor T4, and the reference signal is transmitted to the driving signal output terminal Output through the fifth switch transistor T5 so that the potential of the driving signal output terminal Output becomes a low potential.

In the fourth phase T4, Input=0, Rst1=Rst2=0, CK1=1 or 0, VHD=1.

In the phase T4, the second switch transistor T2 and the fifth switch transistor T5 become to be cut off because the potentials of the Rst1 and Rst2 become low potentials. The first switch transistor T1 remains cutoff because the Input remains at low potential. The sixth switch transistor T6 remains turned on because the VHD remains at high potential. The node control signal is transmitted to the third node C through the sixth switch transistor T6. The third node C remains at high potential. The seventh switch transistor T7 remains turned on. The second node B remains at high potential. The second node B controls the eighth switch transistor T8 and the fourth switch transistor T4 to remain turned on. The reference signal is transmitted to the first node A through the eighth switch transistor T8 so that the first node A is kept at low potential. The capacitor C1 is in discharge state, and the third switch transistor T3, the ninth switch transistor T9 and the tenth switch transistor T10 remain cutoff. Since the third switch transistor T3 is cut off, regardless of whether the CK1 is at high potential or low potential, it has no impact on the driving signal output terminal Output. The reference signal is transmitted to the driving signal output terminal Output through the fourth switch transistor T4 to keep the driving signal output terminal Output at low potential.

Thereafter, the shift register repeats the above-mentioned fourth-phase operation until the shift register starts receiving the input signal of next frame. In this way, in one frame period, during the period from the fourth phase to the start of the next frame, when the first clock signal is at a rising edge, noises would occur to the first node A and the driving signal output terminal Output. However, since the node control signal is a high-potential signal when the first clock signal is at a rising edge, the node control signal controls the potential of the second node B to be a high potential by means of the sixth switch transistor T6 and the seventh switch transistor T7, while the second node B controls the potential of the first node to be a low potential by means of the eighth switch transistor T8 as well and the second node B further controls the driving signal output terminal Output to output a low-potential signal by means of the fourth switch transistor T4, thereby effectively eliminating the noises that would be generated by the first clock signal terminal CK1 on the first node A and the driving signal output terminal Output.

In an embodiment, the first reset control signal terminal Rst1 and the second reset control signal terminal Rst2 are the same signal terminal, the node control signal of the node control signal terminal VHD is the second clock signal, the period width of the first clock signal is equal to the period width of the second clock signal, and the corresponding input-output timing diagram is shown in FIG. 4b. Specifically, four phases T1, T2, T3 and T4 in the input-output timing diagram as shown in FIG. 4b are selected.

In the first phase T1, Input=1, Rst1=Rst2=0, CK1=0, VHD=0 or 1.

In the phase T1, the second switch transistor T2 and the fifth switch transistor T5 are cut off because the Rst1 and Rst2 are at low potential. Since the Input is at high potential, the first switch transistor T1 is turned on, the input signal is transmitted to the first node A through the first switch transistor, the potential of the first node A is a high potential, the capacitor C1 is in charge state, and the third switch transistor T3, the ninth switch transistor T9 and the tenth switch transistor T10 are turned on. The reference signal is transmitted to the third node C through the ninth switch transistor T9. When the VHD is at low potential, the sixth switch transistor T6 is cut off and the potential of the third node C is a low potential. When the VHD is at high potential, the sixth switch transistor T6 is turned on. Due to the setting of width to length ratios of the sixth switch transistor T6 and the ninth switch transistor T9, the potential of the third node C is a low potential. Therefore, regardless of whether the node control signal terminal VHD controls the sixth switch transistor T6 to be turned on or not, the potential of the third node C is a low potential, and the seventh switch transistor T7 is cut off. The reference signal is transmitted to the second node B through the tenth switch transistor T10 and the potential of the second node B is a low potential, thus the fourth switch transistor T4 and the eighth switch transistor T8 are cut off. The first clock signal is transmitted to the driving signal output terminal Output through the third switch transistor T3, and the potential of the driving signal output terminal Output is a low potential.

In the second phase T2, Input=0, Rst1=Rst2=0, CK1=1, VHD=1 or 0.

In the phase T2, the second switch transistor T2 and the fifth switch transistor T5 remain cutoff because the Rst1 and Rst2 remain at low potential. The first switch transistor T1 becomes to be cut off because the potential of the Input becomes a low potential. Since the potential of the CK1 becomes a high potential, the potential of the first node A is further pulled up due to the bootstrap effect of the capacitor C1. The third switch transistor T3, the ninth switch transistor T9 and the tenth switch transistor T10 remain turned on. The reference signal is transmitted to the third node C through the ninth switch transistor T9. When the VHD is at low potential, the sixth switch transistor T6 is cut off and the potential of the third node C is a low potential. When the VHD is at high potential, the sixth switch transistor T6 is turned on. Due to the setting of width to length ratios of the sixth switch transistor T6 and the ninth switch transistor T9, the potential of the point C is a low potential. Therefore, regardless of whether or not the node control signal terminal VHD controls the sixth switch transistor T6 to be turned on, the potential of the third node C is a low potential and the seventh switch transistor T7 is cut off. The reference signal is transmitted to the second node B through the tenth switch transistor T10, the second node B remains at low potential, the first clock signal is transmitted to the driving signal output terminal Output through the third switch transistor T3, and the potential of the driving signal output terminal Output becomes a high potential.

In the third phase T3, Input=0, Rst1=Rst2=1, CK1=0, VHD=0 or 1.

In the phase T3, the second switch transistor T2 and the fifth switch transistor T5 become turned on because the potentials of the Rst1 and Rst2 become high potentials. The first switch transistor T1 remains cutoff because the Input remains at low potential. The reference signal is transmitted to the first node A through the second switch transistor T2, the potential of the first node A becomes a low potential, the capacitor C1 is in discharge state, and the third switch transistor T3, the ninth switch transistor T9 and the tenth switch transistor T10 become to be cut off. When the VHD is at low potential, the sixth switch transistor T6 is cut off, the potential of the third node C is a low potential, the seventh switch transistor T7 is cut off, the second node B remains at low potential, the eighth switch transistor T8 and the fourth switch transistor remain cutoff, the reference signal is transmitted to the driving signal output terminal Output through the fifth switch transistor T5, and the potential of the driving signal output terminal Output becomes a low potential. When the VHD is at high potential, the sixth switch transistor T6 is turned on. The node control signal is transmitted to the third node C through the sixth switch transistor T6, the potential of the third node C becomes a high potential, the seventh switch transistor T7 becomes turned on, the potential of the second node B becomes a high potential, the second node B controls the eighth switch transistor T8 and the fourth switch transistor to become turned on, the reference signal is transmitted to the first node through the eighth switch transistor T8 to further ensure that the potential of the first node A is a low potential. The reference signal is transmitted to the driving signal output terminal Output through the fourth switch transistor T4, and the reference signal is transmitted to the driving signal output terminal Output through the fifth switch transistor T5 so that the potential of the driving signal output terminal Output becomes a low potential.

In the fourth phase T4, Input=0, Rst1=Rst2=0, CK1=1 or 0, VHD=1 or 0.

In the phase T4, the second switch transistor T2 and the fifth switch transistor T5 become to be cut off because the potentials of the Rst1 and Rst2 become low potentials. The first switch transistor T1 remains cutoff because the Input remains at low potential. When the VHD is at high potential, the sixth switch transistor T6 is turned on, the node control signal is transmitted to the third node C through the sixth switch transistor T6, the potential of the third node C is a high potential, the seventh switch transistor T7 is turned on, the potential of the second node B is a high potential, the second node B controls the eighth switch transistor T8 and the fourth switch transistor T4 to be turned on, the reference signal is transmitted to the first node A through the eighth switch transistor T8 so as to keep the first node A at low potential, the capacitor C1 is in discharge state, and the third switch transistor T3, the ninth switch transistor T9 and the tenth switch transistor T10 remain cutoff. Since the third switch transistor T3 is cut off, regardless of whether the CK1 is at high potential or low potential, it has no impact on the driving signal output terminal Output. The reference signal is transmitted to the driving signal output terminal Output through the fourth switch transistor T4 to keep the driving signal output terminal Output at low potential. When the VHD is at low potential, the sixth switch transistor T6 becomes to be cut off, the potential of the third node C becomes a low potential, the seventh switch transistor T7 becomes to be cut off, and the potential of the second node B becomes a low potential. The eighth switch transistor T8 and the fourth switch transistor T4 become to be cut off, the first node A remains at low potential, and the third switch transistor T3, the ninth switch transistor T9 and the tenth switch transistor T10 remain cutoff. Since the third switch transistor T3 is cut off, regardless of whether the CK1 is at high potential or low potential, it has no impact on the driving signal output terminal Output. The driving signal output terminal Output is in floating state and remains at low potential.

Furthermore, in this phase, when the first clock signal is at a rising edge, it would generate noises on the first node A and the driving signal output terminal Output. However, since the node control signal is a high-potential signal when the first clock signal is at a rising edge, the node control signal controls the potential of the second node B to be a high potential by means of the sixth switch transistor T6 and the seventh switch transistor T7, while the second node B controls the potential of the first node A to be a low potential by means of the eighth switch transistor T8 and the second node B further controls the driving signal output terminal Output to output a low-potential signal by means of the fourth switch transistor T4, thereby effectively eliminating the noises that would be generated by the change in the first clock signal on the first node A and the driving signal output terminal Output.

Thereafter, the shift register repeats the above-mentioned fourth-phase operation until the shift register starts receiving the input signal of next frame. In this way, in one frame period, during the period from the fourth phase to the start of the next frame, since the node control signal terminal VHD is of a clock signal, the sixth switch transistor T6, the seventh switch transistor T7, the eighth switch transistor T8 and the fourth switch transistor T4 are in turn-on state only when the node control signal is at high potential, thereby preventing the above four switch transistors from being always in turn-on state in the fourth phase and further extending the service life thereof.

In an embodiment, the first reset control signal of the first reset control signal terminal Rst1 is delayed 0.5 pulse width than the second reset control signal of the second reset control signal terminal Rst2, and the node control signal of the node control signal terminal VHD is a DC signal, and the corresponding input-output timing diagram is shown in FIG.

4c. Specifically, four phases T1, T2, T3 and T4 in the input-output timing diagram as shown in FIG. 4c are selected.

In the first phase T1, Input=1, Rst1=0, Rst2=0, CK1=0, VHD=1.

In phase T1, the specific operation process is the same as the phase T1 in the embodiment shown in FIG. 4a, which is not described here for simplicity.

In the second phase T2, Input=0, Rst1=0, Rst2=0, CK1=1 and VHD=1.

In the phase T2, the specific operation process is the same as the phase T2 in the embodiment shown in FIG. 4a, which is not be described here for simplicity.

In the third phase T3, Input=0, Rst1=0 or 1, Rst2=1, CK1=0, VHD=1.

In the phase T3, since the potential of the Rst2 becomes a high potential, the fifth switch transistor T5 becomes turned on, the reference signal is transmitted to the driving signal output terminal Output through the fifth switch transistor T5, and the potential of the driving signal output terminal Output becomes a low potential. Since the Input remains at low potential, the first switch transistor T1 remains cutoff. Since the VHD remains at high potential, the sixth switch transistor T6 remains turned on. When the Rst1 remains at low potential, the second switch transistor T2 remains cutoff. Since the potential of the CK1 becomes a low potential and the capacitor has bootstrap effect, the potential of the first node A is pulled down but is still at high potential, the third switch transistor T3, the ninth switch transistor T9 and the tenth switch transistor T10 remains turned on, and the reference signal is transmitted to the third node C through the ninth switch transistor T9. When the VHD is at low potential, the sixth switch transistor T6 is cut off and the potential of the third node C is a low potential. When the VHD is at high potential, the sixth switch transistor T6 is turned on. Due to the setting of width to length ratios of the sixth switch transistor T6 and the ninth switch transistor T9, the potential of the third node C is a low potential. Therefore, regardless of whether or not the node control signal terminal VHD controls the sixth switch transistor T6 to be turned on, the potential of the third node C is a low potential and the seventh switch transistor T7 is cut off. The reference signal is transmitted to the second node B through the tenth switch transistor T10, the potential of the second node B is a low potential, thus the fourth switch transistor T4 and the eighth switch transistor remain T8 remain cutoff. The first clock signal is transmitted to the driving signal output terminal Output through the third switch transistor T3 to further ensure that the potential of the driving signal output terminal Output is a low potential. When the potential of the Rst1 becomes a high potential, the second switch transistor T2 becomes turned on, the reference signal is transmitted to the first node A through the second switch transistor T2, the potential of the first node A becomes a low potential, the capacitor C1 is in discharge state, and the third switch transistor T3, the ninth switch transistor T9 and the tenth switch transistor T10 become to be cut off. The node control signal is transmitted to the third node C through the sixth switch transistor T6, the potential of the third node C becomes a high potential, the switch transistor T7 becomes turned on, the potential of the second node B becomes a high potential, the second node B controls the eighth switch transistor T8 and the fourth switch transistor to become turned on, the reference signal is transmitted to the first node A through the eighth switch transistor T8 to further ensure that the potential of the first node A is a low potential, and the reference signal is transmitted to the driving signal output terminal Output through the fourth switch transistor T4 to further ensure that the potential of the driving signal output terminal Output is a low potential.

In the fourth phase T4, Input=0, Rst1=1 or 0, Rst2=0, CK1=1 or 0, VHD=1.

In the phase T4, the first switch transistor T1 remains turned on because the Input remains at low potential. The fifth switch transistor T5 becomes to be cut off because the potential of the Rst2 becomes a low potential, and the sixth switch transistor T6 remains turned on because the VHD remains at high potential. When the Rst1 remains at high potential, the second switch transistor T2 remains turned on, the reference signal is transmitted to the first node A through the second switch transistor T2, the first node A remains at low potential, the capacitor C1 remains in the discharge state, and the third switch transistor T3, the ninth switch transistor T9 and the tenth switch transistor T10 remain cutoff. Therefore, since the third switch transistor T3 is cut off, regardless of whether the CK1 is at high potential or low potential, it has no impact on the driving signal output terminal Output. The node control signal is transmitted to the third node C through the sixth switch transistor T6, the third node C remains at high potential, the seventh switch transistor T7 remains turned on, the second node B remains at high potential, the second node B controls the eighth switch transistor T8 and the fourth switch transistor to be turned on, the reference signal is transmitted to the first node A through the eighth switch transistor T8 to further keep the first node A at low potential, and the reference signal is transmitted to the driving signal output terminal Output through the fourth switch transistor T4 to keep the driving signal output terminal Output at low potential. When the potential of the Rst1 becomes a low potential, the second switch transistor T2 becomes to be cut off. The node control signal is transmitted to the third node C through the sixth switch transistor T6, the third node C remains at high potential, the seventh switch transistor T7 remains turned on, the second node B remains at high potential, the second node B controls the eighth switch transistor T8 and the fourth switch transistor T4 to remain turned on, the reference signal is transmitted to the first node A through the eighth switch transistor T8 to keep the first node A at low potential, the capacitor C1 remains in discharge state, and the third switch transistor T3, the ninth switch transistor T9 and the tenth switch transistor T10 remain cutoff. Since the third switch transistor T3 is cut off, regardless of whether the CK1 is at high potential or low potential, it has no impact on the driving signal output terminal Output. The reference signal is transmitted to the driving signal output terminal Output through the fourth switch transistor T4 so that the driving signal output terminal Output remains at low potential.

Thereafter, the shift register repeats the above-mentioned fourth-phase operation until the shift register starts receiving the input signal of next frame. In this way, in one frame period, during the period from the fourth phase to the start of the next frame, when the first clock signal is at a rising edge, it would generate noises on the first node A and the driving signal output terminal Output. However, since the node control signal is a high-potential signal when the first clock signal is at a rising edge, the node control signal controls the potential of the second node B to be a high potential by means of the sixth switch transistor T6 and the seventh switch transistor T7, while the second node B controls the potential of the first node A to be a low potential by means of the eighth switch transistor T8 and the second node B further controls the driving signal output terminal Output to output a low-potential signal by means of the fourth switch transistor T4, thereby effectively eliminating the noises that would be generated by the first clock signal terminal CK1 on the first node A and the driving signal output terminal Output.

In an embodiment, the first reset control signal of the first reset control signal terminal Rst1 is delayed 0.5 pulse width than the second reset control signal of the second reset control signal terminal Rst2, the node control signal of the node control signal terminal VHD is a second clock signal, the period width of the first clock signal is equal to the period width of the second clock signal, and the corresponding input-output timing diagram is shown in FIG. 4d. Specifically, four phases T1, T2, T3 and T4 in the input-output timing diagram as shown in FIG. 4d are selected.

In the first phase T1, Input=1, Rst1=0, Rst2=0, CK1=0, VHD=0 or 1.

In the phase T1, the specific operation process is the same as the phase T1 in the embodiment as shown in FIG. 4b, which is not described here for simplicity.

In the second phase T2, Input=0, Rst1=0, Rst2=0, CK1=1, VHD=1 or 0.

In the phase T2, the specific operation process is the same as the phase T2 in the embodiment as shown in FIG. 4b, which is not described here for simplicity.

In the third phase T3, Input=0, Rst1=0 or 1, Rst2=1, CK1=0, VHD=0 or 1.

In the phase T3, the first switch transistor T1 remains cutoff because the Input remains at low potential. Since the potential of the Rst2 becomes a high potential, the fifth switch transistor T5 becomes turned on, the reference signal is transmitted to the driving signal output terminal Output through the fifth switch transistor T5, and the potential of the driving signal output terminal Output becomes a low potential. When the Rst1 remains at low potential, the second switch transistor T2 is cut off. Since the potential of the first clock signal becomes a low potential and the function of the capacitor C1, the potential of the first node A is pulled down but is still at high potential, the third switch transistor T3, the ninth switch transistor T9 and the tenth switch transistor T10 are turned on, and the reference signal is transmitted to the third node C through the ninth switch transistor T9. Since the VHD remains at low potential, the sixth switch transistor T6 remains cutoff, and the third node C remains at low potential, the seventh switch transistor T7 remains cutoff. The reference signal is transmitted to the second node B through the tenth switch transistor T10 and the potential of the second node B is a low potential, thus the fourth switch transistor T4 and the eighth switch transistor T8 are cut off. The first clock signal is transmitted to the driving signal output terminal Output through the third switch transistor T3 to further ensure that the potential of the driving signal output terminal Output is a low potential. When the potential of the Rst1 becomes a high potential, the second switch transistor T2 becomes turned on, the reference signal is transmitted to the first node A through the second switch transistor T2, the potential of the first node A becomes a low potential, the capacitor C1 is in discharge state, and the third switch transistor T3, the ninth switch transistor T9 and the tenth switch transistor T10 become to be cut off. Since the potential of the VHD becomes a high potential, the sixth switch transistor T6 is turned on, the node control signal is transmitted to the third node C through the sixth switch transistor T6, the potential of the third node C becomes a high potential, the seventh switch transistor T7 becomes turned on, the potential of the second node B becomes a high potential, and the second node B controls the eighth switch transistor T8 and the fourth switch transistor to become turned on. The reference signal is transmitted to the first node A through the eighth switch transistor T8 to cause the potential of the first node A to become a low potential, the capacitor C1 is in discharge state, and the third switch transistor T3, the ninth switch transistor T9 and the tenth switch transistor T10 become to be cut off. The reference signal is transmitted to the driving signal output terminal Output through the fourth switch transistor T4 to further ensure that the potential of the driving signal output terminal Output is a low potential.

In the fourth phase T4, Input=0, Rst1=1 or 0, Rst2=0, CK1=1 or 0, VHD=1 or 0.

In the phase T4, the first switch transistor T1 remains turned on because the Input remains at low potential, and the fifth switch transistor T5 becomes to be cut off because the potential of the Rst2 becomes a low potential. When the Rst1 remains at high potential, the second switch transistor T2 is turned on, the reference signal is transmitted to the first node A through the second switch transistor T2, and the first node A remains at low potential. The capacitor C1 remains in the discharge state, and the third switch transistor T3, the ninth switch transistor T9 and the tenth switch transistor T10 remains cutoff. Since the third switch transistor T3 is cut off, regardless of whether the CK1 is at high potential or low potential, it has no impact on the driving signal output terminal Output. Since the VHD is at high potential, the sixth switch transistor T6 is turned on, the node control signal is transmitted to the third node C through the sixth switch transistor T6, the potential of the third node C is a high potential, the seventh switch transistor T7 is turned on, the potential of the second node B is a high potential, the second node B controls the eighth switch transistor T8 and the fourth switch transistor T4 to be turned on, the reference signal is transmitted to the first node through the eighth switch transistor T8 to keep the first node A at low potential, the capacitor C1 remains in the discharge state, and the third switch transistor T3 and the ninth switch transistor T9 and the tenth switch transistor T10 remain cutoff. Therefore, since the third switch transistor T3 is cut off, regardless of whether the CK1 is at high potential or low potential, it has no impact on the driving signal output terminal Output. The reference signal is transmitted to the driving signal output terminal Output through the fourth switch transistor T4 so that the driving signal output terminal Output is at low potential. When the potential of the Rst1 becomes a low potential, the second switch transistor T2 is cut off and the potential of the first node A becomes a low potential. When the potential of the VHD becomes a low potential, the sixth switch transistor T6 is cut off, the potential of the third node C is a low potential, the seventh switch transistor T7 is cut off, the potential of the second node B is a low potential, the eighth switch transistor T8 and the fourth switch transistor become to be cut off, the first node A remains at low potential, and the third switch transistor T3, the ninth switch transistor T9 and the tenth switch transistor T10 remain cutoff. Since the third switch transistor T3 is cut off, regardless of whether the CK1 is at high potential or low potential, it has no impact on the driving signal output terminal Output. The driving signal output terminal Output is in floating state and remains at low potential. When the potential of the VHD is a high potential, the sixth switch transistor T6 is turned on, the node control signal is transmitted to the third node C through the sixth switch transistor T6, the potential of the third node C is a high potential, the seventh switch transistor T7 is turned on, the potential of the second node B is a high potential, the second node B controls the eighth switch transistor T8 and the fourth switch transistor T4 to be turned on, the reference signal is transmitted to the first node through the eighth switch transistor T8 so that the potential of the first node A is a low potential, the capacitor C1 remains in discharge state, the third switch transistor T3, and the ninth switch transistor T9 and the tenth switch transistor T10 remain cutoff. Since the third switch transistor T3 is cut off, regardless of whether CK1 is at high potential or low potential, it has no impact on the driving signal output terminal Output, and the reference signal is transmitted to the driving signal output terminal Output through the fourth switch transistor T4 so that the potential of the driving signal output terminal Output is a low potential.

Thereafter, the shift register repeats the above-mentioned fourth-phase operation until the shift register starts receiving the input signal of next frame. In this way, in one frame period, during the period from the fourth phase to the start of the next frame, when the first clock signal is at a rising edge, it would generate noises on the first node A and the driving signal output terminal Output. However, since the node control signal is a high-potential signal when the first clock signal is at a rising edge, the node control signal controls the potential of the second node B to be a high potential by means of the sixth switch transistor T6 and the seventh switch transistor T7, while the second node B controls the potential of the first node A to be a low potential by means of the eighth switch transistor T8 and the second node B further controls the driving signal output terminal Output to output a low-potential signal by means of the fourth switch transistor T4, thereby effectively eliminating the noises that would be generated by the first clock signal terminal CK1 on the first node A and the driving signal output terminal Output.

Furthermore, in this phase, since the node control signal is a clock signal, the sixth switch transistor T6, the seventh switch transistor T7, the eighth switch transistor T8 and the fourth switch transistor T4 are in turn-on state only when the node control signal is a high-potential signal, thereby preventing the above four switch transistors from being always in turn-on state during the fourth phase and further extending the service life thereof.

In an embodiment, the first reset control signal terminal Rst1 and the second reset control signal terminal Rst2 are the same signal terminal, the node control signal of the node control signal terminal VHD is a second clock signal, the period width of the first clock signal is equal to the period width of the second clock signal, and the corresponding input-output timing diagram is shown in FIG. 5a. Specifically, four phases T1, T2, T3 and T4 in the input-output timing diagram as shown in FIG. 5a are selected.

In the first phase T1, Input=1, Rst1=Rst2=0, CK1=0, CKB1=1, VHD=0 or 1.

In the phase T1, the second switch transistor T2 and the fifth switch transistor T5 are cut off because the Rst1 and Rst2 are at low potential. The first switch transistor T1, the twelfth switch transistor T12 and the thirteenth switch transistor T13 are turned on because the Input is at high potential. Since the CKB is at high potential, the fifteenth switch transistor T15 is turned on, the reference signal is transmitted to the driving signal output terminal Output through the fifteenth switch transistor T15, and the potential of the driving signal output terminal Output is a low potential. The driving signal output terminal Output controls the eleventh switch transistor T11 and the fourteenth switch transistor T14 to be cut off. The input signal is transmitted to the first node A through the first switch transistor T1, the potential of the first node A is a high potential, the capacitor C1 is in charge state, and the third switch transistor T3 is turned on. The reference signal is transmitted to the third node C through the twelfth switch transistor T12. When the VHD is at low potential, the sixth switch transistor T6 is cut off and the potential of the third node C is a low potential. When the VHD is at high potential, the sixth switch transistor T6 is turned on. Due to the setting of width to length ratios of the sixth switch transistor T6 and the eleventh switch transistor T11, the potential of the third node C is a low potential. Therefore, regardless of whether or not the node control signal terminal VHD controls the sixth switch transistor T6 to be turned on, the potential of the third node C is a low potential and the seventh switch transistor T7 is cut off. The reference signal is transmitted to the second node B through the thirteenth switch transistor T13 and the potential of the second node B is a low potential, thus the fourth switch transistor T4 and the eighth switch transistor T8 are cut off. The first clock signal is transmitted to the driving signal output terminal Output through the third switch transistor T3 to further ensure that the potential of the driving signal output terminal Output is a low potential.

In the second phase T2, Input=0, Rst1=Rst2=0, CK1=1, CKB1=0, VHD=1 or 0.

In the phase T2, the second switch transistor T2 and the fifth switch transistor T5 remain cutoff because the Rst1 and Rst2 remain at low potential. The first switch transistor T1, the twelfth switch transistor T12, and the thirteenth switch transistor T13 becomes to be cut off because the potential of the Input becomes a low potential. The fifteenth switch transistor T15 becomes to be cut off because the potential of the CKB1 becomes a low potential. Since the potential of the CK1 becomes a high potential, the potential of the first node A is further pulled up due to the bootstrap effect of the capacitor C1, the third switch transistor T3 is turned on, the first clock signal is transmitted to the driving signal output terminal Output through the third switch transistor T3, and the potential of the driving signal output terminal Output is a high potential. The driving signal output terminal Output controls the eleventh switch transistor T11 and the fourteenth switch transistor T14 to be turned on. The reference signal is transmitted to the third node C through the eleventh switch transistor T11. When the VHD is at low potential, the sixth switch transistor T6 is cut off and the potential of the third node C is a low potential. When the VHD is at high potential, the sixth switch transistor T6 is turned on. Due to the setting of width to length ratios of the sixth switch transistor T6 and the eleventh switch transistor T11, the potential of the third node C is a low potential. Therefore, regardless of whether or not the node control signal terminal VHD controls the sixth switch transistor T6 to be turned on, the potential of the third node C is a low potential and the seventh switch transistor T7 is cut off. The reference signal is transmitted to the second node B through the fourteenth switch transistor T14 and the potential of the second node B is a low potential, thus the fourth switch transistor T4 and the eighth switch transistor T8 are cut off.

In the third phase T3, Input=0, Rst1=Rst2=1, CK1=0, CKB1=1, VHD=0 or 1.

In the phase T3, the first switch transistor T1, the twelfth switch transistor T12 and the thirteenth switch transistor T13 remain cutoff because the Input remains at the low potential. The second switch transistor T2 and the fifth switch transistor T5 become turned on because the potentials of the Rst1 and Rst2 become high potentials. Since the potential of the CKB1 becomes a high potential, the fifteenth switch transistor T15 becomes turned on, the reference signal is transmitted to the driving signal output terminal Output through the fifth switch transistor T5, and the potential of the driving signal output terminal is a low potential. Meanwhile, the reference signal is transmitted to the driving signal output terminal Output through the fifteenth switch transistor T15 to further ensure that the potential of the driving signal output terminal Output is a low potential. The reference signal is transmitted to the first node A through the second switch transistor T2, the potential of the first node A becomes a low potential, the capacitor C1 is in discharge state, and the third switch transistor becomes to be cut off. When the VHD remains at low potential, the sixth switch transistor T6 is cut off, the potential of the third node C is a low potential, the seventh switch transistor T7 is cut off and the potential of the second node B is a low potential, thus the fourth switch transistor T4 and the eighth switch transistor T8 are cut off. When the potential of the VHD becomes a high potential, the sixth switch transistor T6 is turned on, the node control signal is transmitted to the third node C through the sixth switch transistor T6, the potential of the third node C becomes a high potential, the seventh switch transistor T7 is turned on, the potential of the second node B becomes a high potential, and the second node B controls the eighth switch transistor T8 and the fourth switch transistor T4 to be turned on. The reference signal is transmitted to the first node A through the eighth switch transistor T8 so that the potential of the first node A is a low potential, the capacitor C1 remains in discharge state, and the third switch transistor T3 becomes to be cut off. The reference signal is transmitted to the driving signal output terminal Output through the fourth switch transistor T4 to further ensure that the potential of the driving signal output terminal Output is a low potential. At the same time, the driving signal output terminal Output controls the eleventh switch transistor T11 and the fourteenth switch transistor T14 to be cut off.

In the fourth phase T4, Input=0, Rst1=Rst2=0, CK1=1 or 0, CKB1=0 or 1, and VHD=1 or 0.

In the phase T4, the first switch transistor T1, the twelfth switch transistor T12 and the thirteenth switch transistor T13 remain cutoff because the Input remains at low potential. The second switch transistor T2 and the fifth switch transistor T5 remain cutoff because the Rst1 and Rst2 remain at low potential. When the CKB1 is at low potential, the fifteenth switch transistor T15 is cut off. When the node control signal terminal VHD is at high potential, the sixth switch transistor T6 is turned on, the node control signal is transmitted to the third node C through the sixth switch transistor T6, the potential of the third node C is a high potential, the seventh switch transistor T7 is turned on, the potential of the second node B is a high potential, and the second node B controls the eighth switch transistor T8 and the fourth switch transistor T4 to be turned on. The reference signal is transmitted to the first node A through the eighth switch transistor T8 so that the potential of the first node A is a low potential, the capacitor C1 is in discharge state, and the third switch transistor T3 becomes to be cut off. Since the third switch transistor T3 is cut off, regardless of whether the CK1 is at high potential or low potential, it has no impact on the driving signal output terminal Output. The reference signal is transmitted to the driving signal output terminal Output through the fourth switch transistor T4 so that the potential of the driving signal output terminal Output is a low potential. When the node control signal terminal VHD is at low potential, the sixth switch transistor T6 is cut off, the potential of the third node C is a low potential, the seventh switch transistor T7 is cut off, and the potential of the second node B is a low potential, thus the fourth switch transistor T4 and the eighth switch transistor T8 are cut off. The driving signal output terminal Output is in the floating state, the potential of the driving signal output terminal Output is a low potential, and the driving signal output terminal Output controls the eleventh switch transistor T11 and the fourteenth switch transistor T14 to become to be cut off. When the CKB1 is at high potential, the fifteenth switch transistor T15 is turned on, the reference signal is transmitted to the driving signal output terminal Output through the fifteenth switch transistor T15, the potential of the driving signal output terminal Output is a low potential, and the driving signal output terminal Output controls the eleventh switch transistor T11 and the fourteenth switch transistor T14 to become to be cut off. When the node control signal terminal VHD is at high potential, the sixth switch transistor T6 is turned on, the node control signal is transmitted to the third node C through the sixth switch transistor T6, the potential of the third node C is a high potential, the seventh switch transistor T7 is turned on, the potential of the second node B is a high potential, and the second node B controls the eighth switch transistor T8 and the fourth switch transistor T4 to be turned on. The reference signal is transmitted to the first node A through the eighth switch transistor T8 so that the potential of the first node A is a low potential, the capacitor C1 remains in discharge state, and the third switch transistor T3 becomes to be cut off. Since the third switch transistor T3 is cut off, regardless of whether the CK1 is at high potential or low potential, it has no impact on the driving signal output terminal Output. The reference signal is transmitted to the driving signal output terminal Output through the fourth switch transistor T4 so that the potential of the driving signal output terminal Output is at low potential and the driving signal output terminal Output controls the eleventh switch transistor T11 and the fourteenth switch transistor T14 to become to be cut off. When the node control signal terminal VHD is at low potential, the sixth switch transistor T6 is cut off, the potential of the third node C is a low potential, the seventh switch transistor T7 is cut off, and the potential of the second node B is a low potential, thus the fourth switch transistor T4 and the eighth switch transistor T8 are cut off, the driving signal output terminal Output is in floating state, the potential of the driving signal output terminal Output is a low potential, and the driving signal output terminal Output controls the eleventh switch transistor T11 and the fourteenth switch transistor T14 to become to be cut off.

Thereafter, the shift register repeats the above-mentioned fourth-phase operation until the shift register starts receiving the input signal of next frame. In this way, in one frame period, during the period from the fourth phase to the start of the next frame, when the first clock signal is at a rising edge, it would generate noises on the first node A and the driving signal output terminal Output. However, since the node control signal is a high-potential signal when the first clock signal is at a rising edge, the node control signal controls the potential of the second node B to be a high potential by means of the sixth switch transistor T6 and the seventh switch transistor T7, while the second node B controls the potential of the first node A to be a low potential by means of the eighth switch transistor T8 and the second node B further controls the driving signal output terminal Output to output a low-potential signal by means of the fourth switch transistor T4, thereby effectively eliminating the noises that would be generated by the first clock signal terminal CK1 on the first node A and the driving signal output terminal Output.

Furthermore, in this phase, since the node control signal is a clock signal, the sixth switch transistor T6, the seventh switch transistor T7, the eighth switch transistor T8 and the fourth switch transistor T4 are in turn-on state only when the node control signal is a high-potential signal, thereby preventing the above four switch transistors from being always in turn-on state during the fourth phase and further extending the service life thereof.

In an embodiment, the first reset control signal of the first reset control signal terminal Rst1 is delayed 0.5 pulse width than the second reset control signal of the second reset control signal terminal Rst2, the node control signal of the node control signal terminal VHD is a second clock signal, the period width of the first clock signal is equal to the period width of the second clock signal, and the corresponding input-output timing diagram is shown in FIG. 5b. Specifically, four phases T1, T2, T3 and T4 in the input-output timing diagram as shown in FIG. 5b are selected.

In the first phase T1, Input=1, Rst1=0, Rst2=0, CK1=0, CKB1=1, VHD=0 or 1.

In the phase T1, the specific operation process is the same as the phase T1 in the embodiment as shown in FIG. 5a, which is not described here for simplicity.

In the second phase T2, Input=0, Rst1=0, Rst2=0, CK1=1, CKB=0, VHD=1 or 0.

In the phase T2, the specific operation process is the same as the phase T2 in the embodiment as shown in FIG. 5a, which is not described here for simplicity.

In the third phase T3, Input=0, Rst1=0 or 1, Rst2=1, CK1=0, CKB=1, VHD=0 or 1.

In the phase T3, the first switch transistor T1, the twelfth switch transistor T12, and the thirteenth switch transistor T13 remain cutoff because the Input remains at low potential. The fifteenth switch transistor T15 becomes turned on because the potential of the CKB1 becomes a high potential. The reference signal is transmitted to the driving signal output terminal Output through the fifteenth switch transistor T15, the potential of the driving signal output terminal Output becomes a low potential, and the driving signal output terminal Output controls the eleventh switch transistor T11 and the fourteenth switch transistor T14 to become to be cut off. Since the potential of the Rst2 becomes a high potential, the fifth switch transistor T5 is turned on, and the reference signal is transmitted to the driving signal output terminal Output through the fifth switch transistor T5 to further ensure that the potential of the driving signal output terminal Output is a low potential. When Rst1 is at low potential, the second switch transistor T2 is cut off. Since the potential of the CK1 becomes a low potential and the function of the capacitor C1, the potential of the first node A is pulled down but still remains at high potential. The third switch transistor T3 remains turned on. The first clock signal is transmitted to the driving signal output terminal Output through the third switch transistor T3 to further ensure that the potential of the driving signal output terminal Output is a low potential. At that time, when the node control signal terminal VHD is at low potential, the second node B and the third node C are both at low potential, and the seventh switch transistor T7, the fourth switch transistor T4 and the eighth switch transistor T8 are cut off. When the node control signal terminal VHD is at high potential, the sixth switch transistor T6 is turned on, the node control signal is transmitted to the third node C through the sixth switch transistor T6, the potential of the third node C is a high potential, the seventh switch transistor T7 is turned on, the potential of the second node B is a high potential, and the second node B controls the eighth switch transistor T8 and the fourth switch transistor T4 to be turned on. The reference signal is transmitted to the first node A through the eighth switch transistor T8 so that the potential of the first node A is a low potential, the capacitor C1 is in discharge state, and the third switch transistor T3 becomes to be cut off. The reference signal is transmitted to the driving signal output terminal Output through the fourth switch transistor T4 to further ensure that the potential of the driving signal output terminal Output is a low potential. When the Rst1 is at high potential, the second switch transistor T2 is turned on, the reference signal is transmitted to the first node A through the second switch transistor T2, the potential of the first node A becomes a low potential, the capacitor C1 is in discharge state, and the third switch transistor T3 becomes to be cut off. At that time, when the node control signal terminal VHD is at low potential, the second node B and the third node C are both at low potential, and the seventh switch transistor T7, the fourth switch transistor T4 and the eighth switch transistor T8 are cut off. When the node control signal terminal VHD is at high potential, the sixth switch transistor T6 is turned on, the node control signal is transmitted to the third node C through the sixth switch transistor T6, the potential of the third node C is a high potential, the seventh switch transistor T7 is turned on, the potential of the second node B is a high potential, and the second node B controls the eighth switch transistor T8 and the fourth switch transistor T4 to be turned on. The reference signal is transmitted to the first node A through the eighth switch transistor T8 to further ensure that the potential of the first node A is a low potential. The reference signal Vref is transmitted to the driving signal output terminal Output through the fourth switch transistor T4 to further ensure that the potential of the driving signal output terminal Output is a low potential.

In the fourth phase T4, Input=0, Rst1=1 or 0, Rst2=0, CK1=1 or 0, CKB1=0 or 1, VHD=1 or 0.

In the phase T4, the first switch transistor T1, the twelfth switch transistor T12 and the thirteenth switch transistor T13 remain cutoff because the Input remains at low potential. The fifth switch transistor T5 becomes to be cut off because the potential of the Rst2 becomes a low potential. When the Rst1 is high potential, the second switch transistor T2 is turned on, the reference signal is transmitted to the first node A through the second switch transistor T2, the potential of the first node A is a low potential, the capacitor C1 remains in discharge state, and the third switch to transistor T3 remains cutoff. Therefore, since the third switch transistor T3 is cut off, regardless of whether the CK1 is at high potential or low potential, it has no impact on the driving signal output terminal Output. Since the node control signal terminal VHD is at high potential, the sixth switch transistor T6 is turned on, the node control signal is transmitted to the third node C through the sixth switch transistor T6, the potential of the third node C is a high potential, the seventh switch transistor T7 is turned on, the potential of the second node B is a high potential, and the second node B controls the eighth switch transistor T8 and the fourth switch transistor T4 to be turned on. The reference signal is transmitted to the first node A through the eighth switch transistor T8 to further ensure that the potential of the first node A is a low potential. The reference signal is transmitted to the driving signal output terminal Output through the fourth switch transistor T4, the potential of the driving signal output terminal Output is a low potential, and the driving signal output terminal Output controls the eleventh switch transistor T11 and the fourteenth switch transistor T14 to become to be cut off. Since the CKB is at low potential, the fifteenth switch transistor T15 is cut off. When the potential of the Rst1 becomes a low potential, the second switch transistor T2 becomes to be cut off. When the CKB1 is at low potential, the fifteenth switch transistor T15 is cut off. When the node control signal terminal VHD is at high potential, the sixth switch transistor T6 is turned on. The node control signal is transmitted to the third node C through the sixth switch transistor T6, the potential of the third node C is a high potential, the seventh switch transistor T7 is turned on, the potential of the second node B is a high potential, and the second node B controls the eighth switch transistor T8 and the fourth switch transistor T4 to be turned on. The reference signal is transmitted to the first node A through the eighth switch transistor T8 such that the potential of the first node A is a low potential, the capacitor C1 is in discharge state, and the third switch transistor T3 becomes to be cut off. Since the third switch transistor T3 is cut off, regardless of whether the CK1 is at high potential or low potential, it has no impact on the driving signal output terminal Output. The reference signal is transmitted to the driving signal output terminal Output through the fourth switch transistor T4 so that the potential of the driving signal output terminal Output is a low potential. When the node control signal terminal VHD is at low potential, the sixth switch transistor T6 is cut off, the potential of the third node C is a low potential, the seventh switch transistor T7 is cut off, and the potential of the second node B is a low potential, thus the fourth switch transistor T4 and the eighth switch transistor T8 are cut off. The driving signal output terminal Output is in floating state, the potential of the driving signal output terminal Output is a low potential, and the driving signal output terminal Output controls the eleventh switch transistor T11 and the fourteenth switch transistor T14 to become to be cut off. When the CKB1 is at high potential, the fifteenth switch transistor T15 is turned on, the reference signal is transmitted to the driving signal output terminal Output through the fifteenth switch transistor T15, the potential of the driving signal output terminal Output is a low potential, and the driving signal output terminal Output controls the eleventh switch transistor T11 and the fourteenth switch transistor T14 to become to be cut off. When the node control signal terminal VHD is at high potential, the sixth switch transistor T6 is turned on, the node control signal is transmitted to the third node C through the sixth switch transistor T6, the potential of the third node C is a high potential, the seventh switch transistor T7 is turned on, the potential of the second node B is a high potential, and the second node B controls the eighth switch transistor T8 and the fourth switch transistor T4 to be turned on. The reference signal is transmitted to the first node A through the eighth switch transistor T8 so that the potential of the first node A is a low potential, the capacitor C1 remains in discharge state, and the third switch transistor T3 becomes to be cut off. Since the third switch transistor T3 is cut off, regardless of whether the CK1 is at high potential or low potential, it has no impact on the driving signal output terminal Output. The reference signal is transmitted to the driving signal output terminal Output through the fourth switch transistor T4 so that the potential of the driving signal output terminal Output is a low potential. The driving signal output terminal Output controls the eleventh switch transistor T11 and the fourteenth switch transistor T14 to become to be cut off. When the node control signal terminal VHD is at low potential, the sixth switch transistor T6 is cut off, the potential of the third node C is a low potential, the seventh switch transistor T7 is cut off, and the potential of the second node B is a low potential, thus the fourth switch transistor T4 and the eighth switch transistor T8 are cut off. The driving signal output terminal Output is in floating state, the potential of the driving signal output terminal Output is a low potential, and the driving signal output terminal Output controls the eleventh switch transistor T11 and the fourteenth switch transistor T14 to become to be cut off.

Thereafter, the shift register repeats the above-mentioned fourth-phase operation until the shift register starts receiving the input signal of next frame. In this way, in one frame period, during the period from the fourth phase to the start of the next frame, when the first clock signal is at a rising edge, it would generate noises on the first node A and the driving signal output terminal Output. However, since the node control signal is a high-potential signal when the first clock signal is at a rising edge, the node control signal controls the potential of the second node B to be a high potential by means of the sixth switch transistor T6 and the seventh switch transistor T7, while the second node B controls the potential of the first node A to be a low potential by means of the eighth switch transistor T8 and the second node B further controls the driving signal output terminal Output to output a low-potential signal by means of the fourth switch transistor T4, thereby effectively eliminating the noises that would be generated by the first clock signal terminal CK1 on the first node A and the driving signal output terminal Output.

Furthermore, in this phase, since the node control signal is a clock signal, the sixth switch transistor T6, the seventh switch transistor T7, the eighth switch transistor T8 and the fourth switch transistor T4 are in turn-on state only when the node control signal is a high-potential signal, thereby preventing the above four switch transistors from being always in turn-on state during the fourth phase and further extending the service life thereof.

The above-mentioned embodiments are described by taking an N-type switch transistor as an example. Specifically, the working principle of a P-type switch transistor is similar to that of the above-mentioned N-type switch transistor except that the P-type switch transistor is turned on at low level, which is not described here for simplicity.

Figure 6:
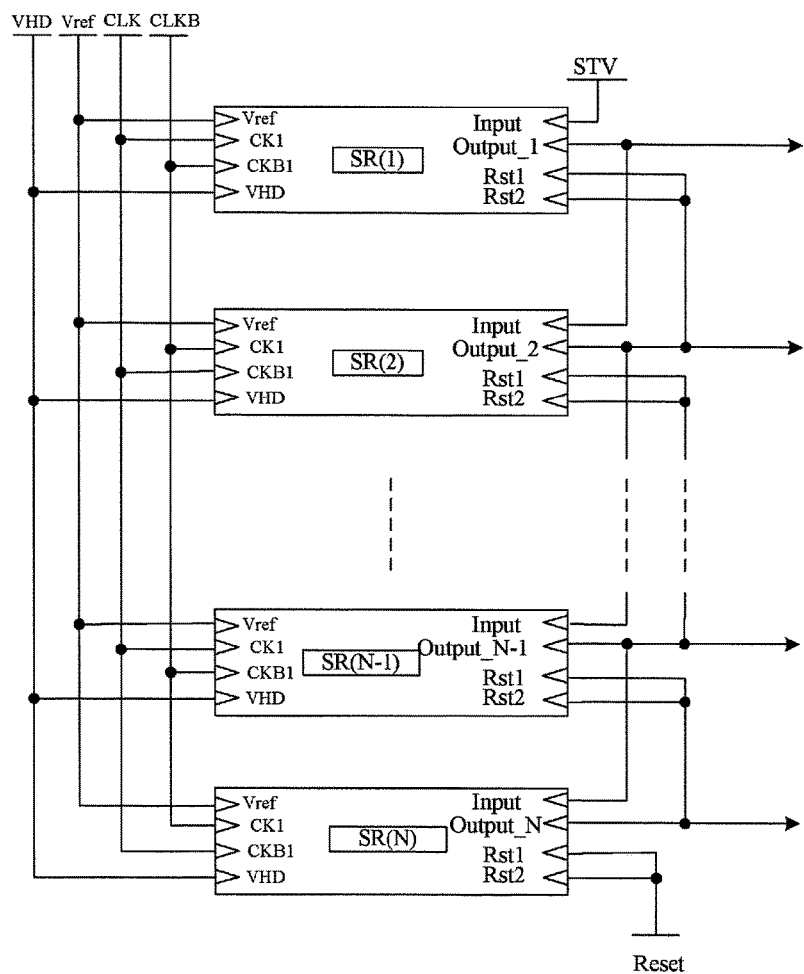
FIG. 6 is a schematic structural diagram of a gate driving circuit provided by embodiments of the present disclosure.

On the basis of the same inventive concept, embodiments of the present disclosure further provide a gate driving circuit comprising, as shown in FIG. 6, a plurality of cascaded shift registers SR(1), SR(2) . . . SR(n) . . . SR(N−1), SR(N) (N shift registers in total, 1≤n≤N), wherein, for respective stages of shift registers, when the first reset control signal terminal Rst1 and the second reset control signal terminal Rst2 are the same signal terminal, except for the first-stage shift register SR(1), the driving signal output terminal Output_n of the shift register SR(n) of each of the remaining stages is connected to the first reset control signal terminal Rst1 and the second reset control signal terminal Rst2 of the shift register SR(n−1) of one adjacent upper stage, respectively;

except for the last-stage shift register SR(N), the drive signal output terminal Output_n of the shift register SR(n) of each of the remaining stages is connected to the input signal terminal Input of the shift register SR(n+1) of one adjacent lower stage, respectively;

the input signal terminal Input of the first-stage shift register SR(1) is connected to a frame start signal terminal STV.

Further, the first reset control signal terminal Rst1 and the second reset control signal terminal Rst2 of the last-stage shift register SR(N) are both connected to a reset control terminal Reset for resetting the first node and the driving signal output terminal of the last-stage shift register SR(N) after the last-stage shift register SR(N) outputs a scanning signal. The reset control terminal Reset of the present embodiment may be arranged individually or may be shared with other terminals as long as it satisfies the condition that the last-stage shift register SR(N) can be normally reset.

Specifically, each shift register in the above gate driving circuit is identical with the above shift register of the present disclosure in terms of function and structure, repeated parts of which are not described for simplicity.

Specifically, in the above shift register provided by embodiments of the present disclosure, as shown in FIG. 6, the reference signal terminals Verf of respective stages of shift registers are connected to the same reference signal terminal Verf, the first clock signal terminals CK1 of odd-stage shift registers and the third clock signal terminals CKB1 of even-stage shift registers are all connected to the same clock signal terminal CLK, and the third clock signal terminals CKB1 of the odd-stage shift registers and the first clock signal terminals CK1 of the even-stage shift registers are all connected to the same clock signal terminal CLKB. When the node control signal of the node control signal terminal VHD is a DC signal, the node control signal terminals VHD of respective stages of shift registers are connected to the same node control signal terminal VHD.

Figure 7:
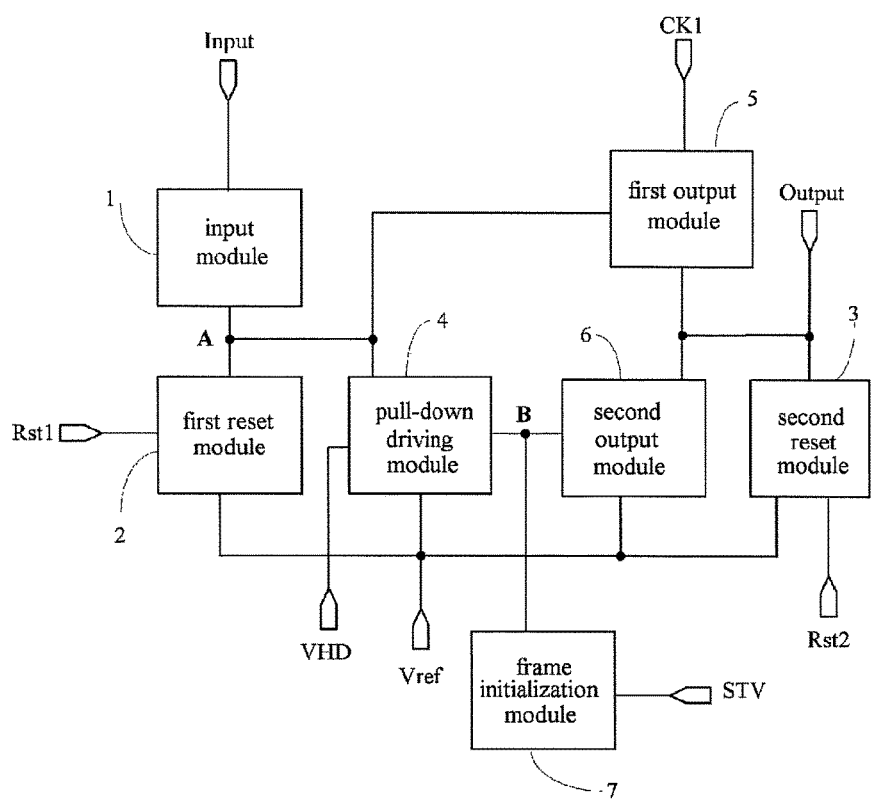
FIG. 7 is a schematic structural diagram of a shift register comprising a frame initialization module as provided by embodiments of the present disclosure.

Alternatively, in the above gate driving circuit provided by embodiments of the present disclosure, except for the first-stage shift register, the shift register of each of the remaining stages further comprises a frame initialization module 7, wherein as shown in FIG. 7, the input terminal of the frame initialization module 7 is connected to the frame start signal terminal STV, and the output terminal thereof is connected to the second node B.

The frame initialization module 7 is configured to initialize the driving signal output terminal of the shift register under the control of the frame start signal terminal STV. In this manner, when the first-stage shift register and the second-stage shift register receive an input signal, the frame initialization modules of other stages of shift registers control the potentials of the second nodes B of other stages of shift registers to be reset, thereby initializing the driving signal output terminals of the shift registers.

Figure 8A:
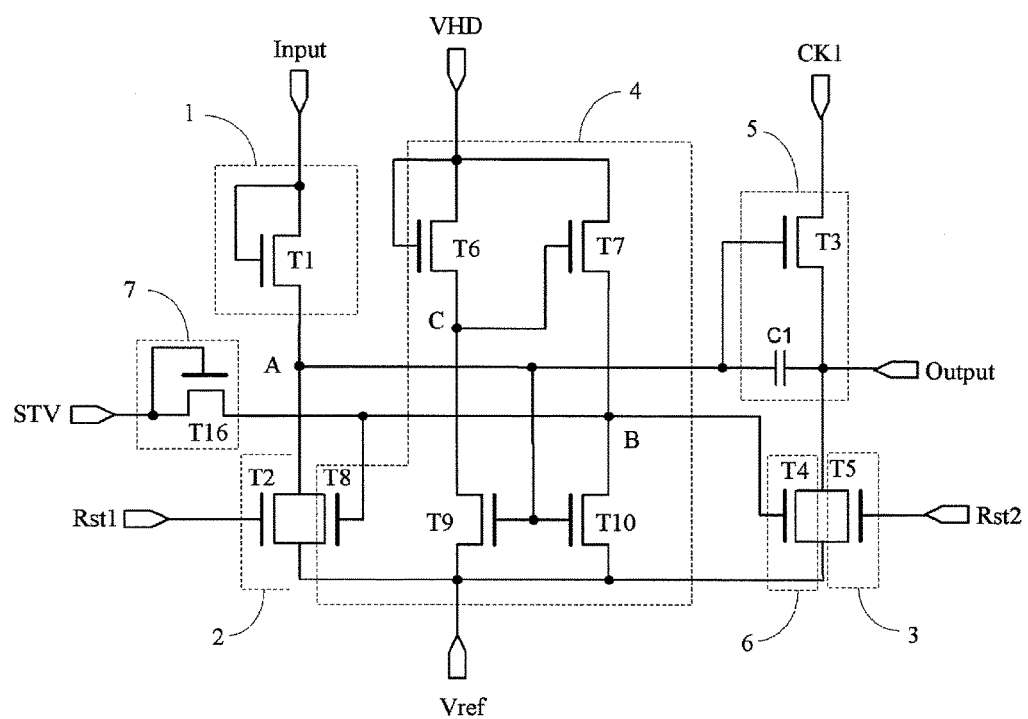
FIGS. 8a and 8b are a schematic diagram of a specific structure of a shift register comprising a frame initialization module as provided by embodiments of the present disclosure, respectively.
Figure 8B:
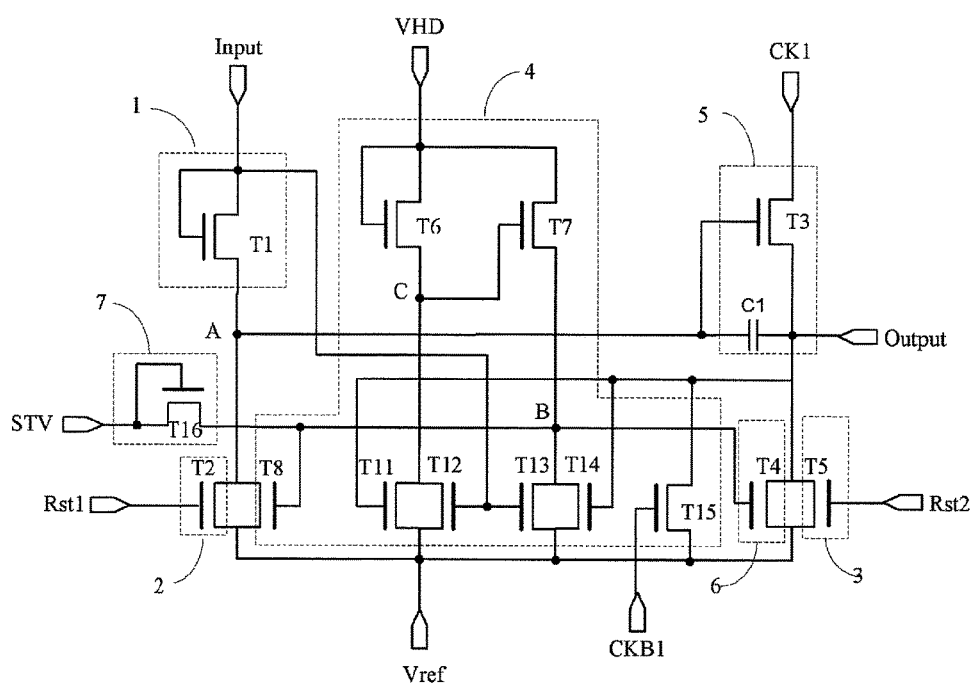

In the above gate driving circuit provided by embodiments of the present disclosure, as shown in FIGS. 8a and 8b, the frame initialization module 7 specifically comprises a sixteenth switch transistor T16, wherein the gate and the source of the sixteenth switch transistor T16 are both connected to the frame start signal terminal STV, and the drain of the sixteenth switch transistor T16 is connected to the second node B.

Upon implementation, the sixteenth switch transistor T16 may be an N-type transistor or a P-type transistor, which is not limited here.

The above specific structure of the frame initialization module in the shift register is just illustrative. Upon implementation, the specific structure of the frame initialization module is not limited to the above structure provided by embodiments of the present disclosure, and may also be other structures known to those skilled in the art, which is not limited here.

Figure 9:
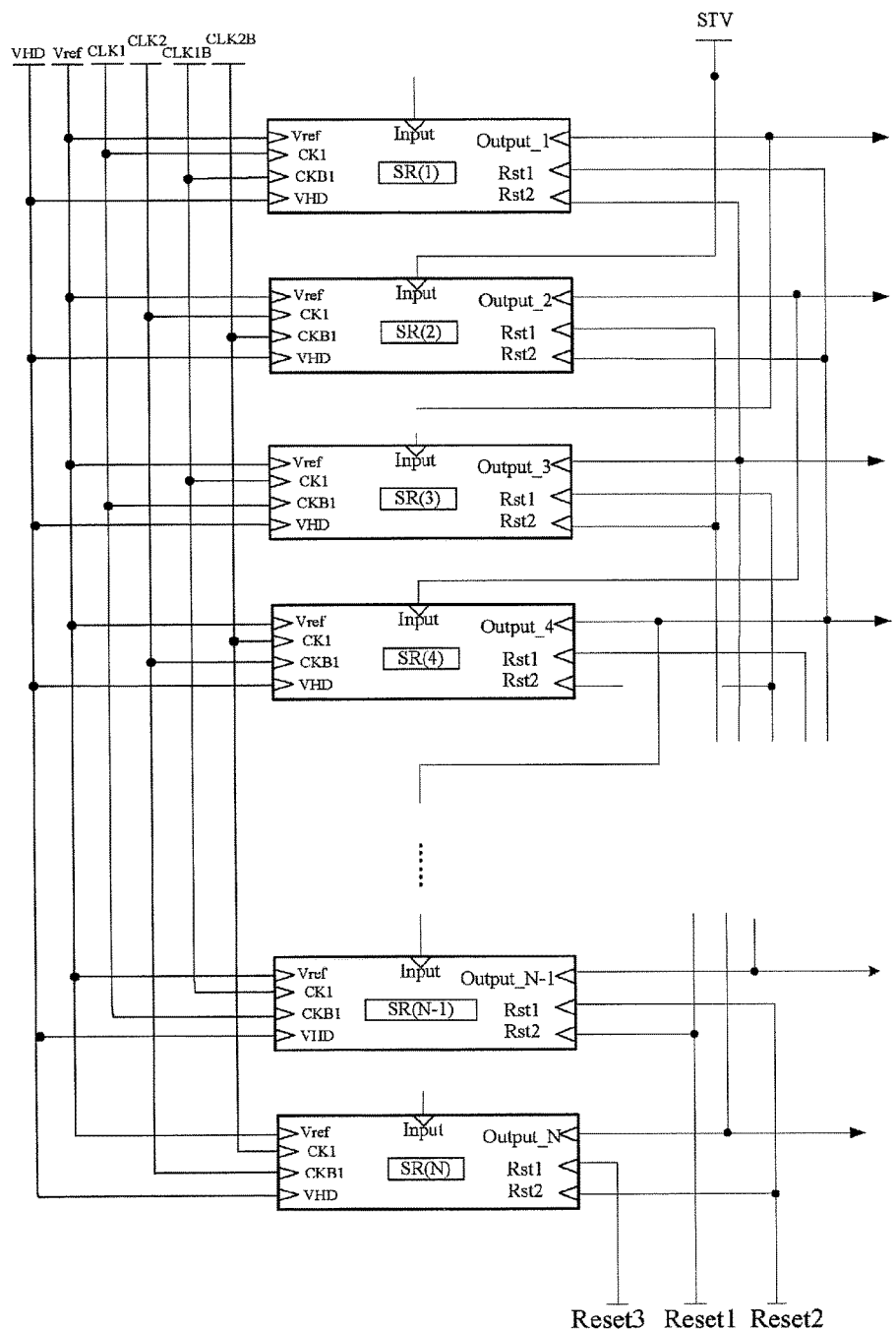
FIG. 9 is a schematic structural diagram of a gate driving circuit provided by embodiments of the present disclosure.

On the basis of the same inventive concept, embodiments of the present disclosure further provide a gate driving circuit comprising, as shown in FIG. 9, a plurality of cascaded shift registers SR(1), SR(2) . . . SR(n) . . . SR (N−1) and SR (N) (N shift registers in total, 1≤n≤N). FIG. 9 only shows connection relationships of SR(1), SR(2), SR(3) and SR(4), wherein, for respective stages of shift registers, when the signal of the first reset control signal terminal Rst1 is delayed more than zero less than one pulse width from the signal of the second reset control signal terminal Rst2, except for the first-stage shift register SR(1) and the second-stage shift register SR(2), the drive signal output terminal Output_n of the shift register SR(n) of each of the remaining stages is connected to the second reset control signal terminals Rst2 of the shift register SR(n−2), respectively;

except for the first-stage shift register SR(1), the second reset control signal terminal Rst2 of the shift register SR(n) of each of the remaining stages is connected to the first reset control signal terminal Rst1 of the shift register SR(n−1), respectively;

Except for the shift registers of the last two stages, the driving signal output signal Output_n of the shift register SR(n) of each of the remaining stages is connected to the input signal terminal Input of the shift register SR(n+2), respectively;

the input signal terminals Input of the first-stage shift register SR(1) and the second-stage shift register SR(2) are connected to the frame start signal terminal STV.

Further, as shown in FIG. 9, the second reset control signal terminal Rst2 of the shift register SR(N−1) of the penultimate stage is connected to a first reset control terminal Reset1, and the first reset control signal terminal Rst1 of the shift register SR(N−1) of the penultimate stage is connected to a second reset control terminal Reset2 for resetting the first node and the driving signal output terminal of the last-stage shift register SR(N) after the shift register SR(N−1) of the penultimate stage outputs a scanning signal. The first reset control signal terminal Rst1 of the last-stage shift register SR(N) is connected to a third reset control terminal Reset3, and the second reset control signal terminal Rst2 of the last-stage shift register SR(N) is connected to the second reset control terminal Reset2 for resetting the first node and the driving signal output terminal of the last-stage shift register SR(N) after the last-stage shift register SR(N) outputs a scanning signal.

Specifically, each shift register in the above gate driving circuit is identical with the shift register of the present disclosure in terms of function and structure, repeated parts of which are not described for simplicity.

Specifically, in the above gate driving circuit provided by embodiments of the present disclosure, as shown in FIG. 9, the reference signal terminals Verf of respective stages of shift registers are connected to the same reference signal terminal Verf, the first clock signals CK1 of the shift registers of the $(4n+1)^{th}$ stages (n=0, 1, 2, 3 . . . ) and the third clock signals CKB1 of the shift registers of the $(4n+3)^{th}$ stages are both connected to the same clock signal terminal CLK1, the third clock signals CKB1 of the shift registers of the $(4n+1)^{th}$ stages and the first clock signals CK1 of the shift registers of the $(4n+3)^{th}$ stages are both connected to the same clock signal terminal CLK1B, the first clock signals CK1 of the shift registers of the $(4n+2)^{th}$ stages and the third clock signals CKB1 of the shift registers of the (4n+4) stages are both connected to the same clock signal terminal CLK2, and the third clock signals CKB1 of the shift registers of the $(4n+2)^{th}$ stages and the first clock signals CK1 of the shift registers of the $(4n+4)^{th}$ stages are both connected to the same clock signal terminal CLK2B. When the node control signal of the node control signal terminal VHD is a DC signal, the node control signal terminals VHD of respective stages of shift registers are all connected to the same node control signal terminal VHD.

Alternatively, in the above gate driving circuit provided by embodiments of the present disclosure, except for the first-stage shift register and the second-stage shift register, the shift register of each of the remaining stages further comprises a frame initialization module 7, wherein as shown in FIG. 7, the input terminal of the frame initialization module 7 is connected to the frame start signal terminal STV, and the output terminal thereof is connected to the second node B.

The frame initialization module 7 is configured to initialize the driving signal output terminal of the shift register under the control of the frame start signal terminal STV. In this manner, when the first-stage shift register and the second-stage shift register receive an input signal, the frame initialization modules of other stages of shift registers control the potentials of the second nodes B of other stages of shift registers to be reset, thereby initializing the driving signal output terminals of the shift registers.

Alternatively, in the above gate driving circuit provided by embodiments of the present disclosure, as shown in FIGS. 8a and 8b, the frame initialization module 7 specifically comprises a sixteenth switch transistor T16, wherein the gate and the source of the sixteenth switch transistor T16 are both connected to the frame start signal terminal STV, and the drain of the sixteenth switch transistor T16 is connected to the second node B.

Upon implementation, the sixteenth switch transistor T16 may be an N-type transistor or a P-type transistor, which is not limited here.

The above specific structure of the frame initialization module in the shift register is just illustrative. Upon implementation, the specific structure of the frame initialization module is not limited to the above structure provided by embodiments of the present disclosure, and may also be other structures known to those skilled in the art, which is not limited here.

On the basis of the same inventive concept, embodiments of the present disclosure further provide a display device comprising the above gate driving circuit through which a scanning signal is supplied to respective gate lines on the array substrate in the display device. The implementation thereof may refer to the description of the above gate driving circuit, and the same parts are not repeated here.

On the basis of the same inventive concept, embodiments of the present disclosure further provide a driving method of any of the shift registers described above including an input phase, an output phase, a reset phase and a reset hold phase, wherein during the reset hold phase, the pull-down driving module eliminates the noise on the first node resulting from the change in the first clock signal under the control of the node control signal terminal.

Specifically, in the above driving method provided by embodiments of the present disclosure, the input phase corresponds to the phase T1 in the embodiments described above, the output phase corresponds to the phase T2 in the embodiments described above, the reset phase corresponds to the phase T3 in the embodiments described above, and the reset hold phase corresponds to the phase T4 in the embodiments described above. The detailed processes will not be described in detail.

Alternatively, in the above driving method provided by embodiments of the present disclosure, when the effective pulse signal of the input signal terminal is a high-potential signal, the node control signal is a high-potential signal at least when the first clock signal is at a rising edge.

Alternatively, in the above driving method provided by embodiments of the present disclosure, when the effective pulse signal of the input signal terminal is a low-potential signal, the node control signal is a low-potential signal at least when the first clock signal is at a falling edge.

Embodiments of the present disclosure provide a shift register, a driving method thereof, a gate driving circuit and a display device. The shift register comprises an input module, a first reset module, a second reset module, a pull-down driving module, a first output module and a second output module, wherein the input module is configured to control the potential of the first node under the control of the input signal terminal, the first reset module is configured to provide the reference signal of the reference signal terminal to the first node under the control of the first reset control signal terminal, the second reset module is configured to provide the reference signal to the driving signal output terminal under the control of the second reset control signal terminal, the first output module is configured to provide the first clock signal of the first clock signal terminal to the driving signal output terminal under the control of the first node, the second output module is configured to provide the reference signal to the driving signal output terminal under the control of the second node, the pull-down driving module is configured to control the potential of the second node to be a second potential when the potential of the first node is a first potential, control the potential of the first node to be the second potential when the potential of the second node is the first potential, and control the potential of the second node to be the first potential when the potential of the node control signal terminal is the first potential and the potential of the first node is the second potential. Since the node control signal at the node control signal terminal can eliminate the noise on the first node resulting from the change in the first clock signal, the output stability of the shift register can be improved.

Obviously, those skilled in the art can make various modifications and variations to the present disclosure without departing from the spirit and scope thereof. In this way, if these modifications and variations to the present disclosure pertain to the scope of the claims of the present disclosure and equivalent technologies thereof, the present disclosure also intends to encompass these modifications and variations.

The invention claimed is:

1. A shift register comprising: an input module, a first reset module, a second reset module, a first output module, a second output module and a pull-down driving module; wherein a first terminal of the input module is connected to an input signal terminal, a second terminal of the input module is connected to a first node; the input module is configured to control a potential of the first node under the control of the input signal terminal;

a first terminal of the first reset module is connected to a reference signal terminal, a second terminal of the first reset module is connected to a first reset control signal terminal, a third terminal of the first reset module is connected to the first node; the first reset module is configured to provide a reference signal of the reference signal terminal to the first node under the control of the first reset control signal terminal;

a first terminal of the second reset module is connected to a second reset control signal terminal, a second terminal of the second reset module is connected to the reference signal terminal, a third terminal of the second reset module is connected to a driving signal output terminal; the second reset module is configured to provide the reference signal to the driving signal output terminal under the control of the second reset control signal terminal;

a first terminal of the first output module is connected to a first clock signal terminal for receiving a first clock signal, a second terminal of the first output module is connected to the first node, a third terminal of the first output module is connected to the driving signal output terminal; the first output module is configured to provide the first clock signal of the first clock signal terminal to the driving signal output terminal under the control of the first node;

a first terminal of the second output module is connected to the reference signal terminal, a second terminal of the second output module is connected to a second node, a third terminal of the second output module is connected to the driving signal output terminal; the second output module is configured to provide the reference signal to the driving signal output terminal under the control of the second node;

a first terminal of the pull-down driving module is connected to a node control signal terminal, a second terminal of the pull-down driving module is connected to the reference signal terminal, a third terminal of the pull-down driving module is connected to the first node, a fourth terminal of the pull-down driving module is connected to the second node; the pull-down driving module is configured to control a potential of the second node to be a second potential when the potential of the first node is a first potential, and control the potential of the first node to be the second potential when the potential of the second node is the first potential;

when an effective pulse signal of the input signal terminal is a high-potential signal, the first potential is a high potential and the second potential is a low potential; when the effective pulse signal of the input signal terminal is a low-potential signal, the first potential is a low potential and the second potential is a high potential; a node control signal of the node control signal terminal is configured to eliminate a noise on the first node resulting from change in the first clock signal wherein the pull-down driving module further comprises a fifth terminal connected to the input signal terminal, a sixth terminal connected to the driving signal output terminal, and a seventh terminal connected to a third clock signal terminal for receiving a third clock signal, wherein the pull-down driving module comprises a sixth switch transistor, a seventh switch transistor, an eighth switch transistor, an eleventh switch transistor, a twelfth switch transistor, a thirteenth switch transistor, a fourteenth switch transistor and a fifteenth switch transistor; wherein a gate and a source of the sixth switch transistor are both connected to the node control signal terminal, a drain of the sixth switch transistor is connected to a gate of the seventh switch transistor, a source of the eleventh switch transistor and a source of the twelfth switch transistor, respectively;

a source of the seventh switch transistor is connected to the node control signal terminal, a drain of the seventh switch transistor is connected to the second node;

a gate of the eighth switch transistor is connected to the second node, a source of the eighth switch transistor is connected to the first node, a drain of the eighth switch transistor is connected to the reference signal terminal;

a gate of the eleventh switch transistor is connected to the driving signal output terminal, a drain of the eleventh switch transistor is connected to the reference signal terminal;

a gate of the twelfth switch transistor is connected to the input signal terminal and a drain of the twelfth switch transistor is connected to the reference signal terminal;

a gate of the thirteenth switch transistor is connected to the input signal terminal, a source of the thirteenth switch transistor is connected to the second node, a drain of the thirteenth switch transistor is connected to the reference signal terminal;

a gate of the fourteenth switch transistor is connected to the driving signal output terminal, a source of the fourteenth switch transistor is connected to the second node, a drain of the fourteenth switch transistor is connected to the reference signal terminal;

a gate of the fifteenth switch transistor is connected to the third clock signal terminal, a source of the fifteenth switch transistor is connected to the driving signal output terminal, a drain of the fifteenth switch transistor is connected to the reference signal terminal, wherein the node control signal is a second clock signal, and a duty cycle of the second clock signal is 2% to 50%;

wherein the third clock signal has a phase opposite to the first clock signal; and wherein the second clock signal is different from the first and third clock signals.

2. A gate driving circuit comprising a plurality of cascaded shift registers, each shift register comprising an input module, a first reset module, a second reset module, a first output module, a second output module and a pull-down driving module; wherein a first terminal of the input module is connected to an input signal terminal, a second terminal of the input module is connected to a first node; the input module is configured to control a potential of the first node under the control of the input signal terminal;

a first terminal of the first reset module is connected to a reference signal terminal, a second terminal of the first reset module is connected to a first reset control signal terminal, a third terminal of the first reset module is connected to the first node; the first reset module is configured to provide a reference signal of the reference signal terminal to the first node under the control of the first reset control signal terminal;

a first terminal of the second reset module is connected to a second reset control signal terminal, a second terminal of the second reset module is connected to the reference signal terminal, a third terminal of the second reset module is connected to a driving signal output terminal; the second reset module is configured to provide the reference signal to the driving signal output terminal under the control of the second reset control signal terminal for receiving a first clock signal;

a first terminal of the first output module is connected to a first clock signal terminal, a second terminal of the first output module is connected to the first node, a third terminal of the first output module is connected to the driving signal output terminal; the first output module is configured to provide the first clock signal of the first clock signal terminal to the driving signal output terminal under the control of the first node;

a first terminal of the second output module is connected to the reference signal terminal, a second terminal of the second output module is connected to a second node, a third terminal of the second output module is connected to the driving signal output terminal; the second output module is configured to provide the reference signal to the driving signal output terminal under the control of the second node;

a first terminal of the pull-down driving module is connected to a node control signal terminal, a second terminal of the pull-down driving module is connected to the reference signal terminal, a third terminal of the pull-down driving module is connected to the first node, a fourth terminal of the pull-down driving module is connected to the second node; the pull-down driving module is configured to control a potential of the second node to be a second potential when the potential of the first node is a first potential, and control the potential of the first node to be the second potential when the potential of the second node is the first potential;

wherein the pull-down driving module further comprises a fifth terminal connected to the input signal terminal, a sixth terminal connected to the driving signal output terminal, and a seventh terminal connected to a third clock signal terminal for receiving a third clock signal;

when an effective pulse signal of the input signal terminal is a high-potential signal, the first potential is a high potential and the second potential is a low potential; when the effective pulse signal of the input signal terminal is a low-potential signal, the first potential is a low potential and the second potential is a high potential; a node control signal of the node control signal terminal is configured to eliminate a noise on the first node resulting from change in the first clock signal, wherein a signal of the first reset control signal terminal is delayed more than zero less than one pulse width than a signal of the second reset control signal terminal, wherein driving signal output terminal of a shift register of the $h^{th}$ stage is connected to a second reset control signal terminal of a shift register of an $(h-2)^{th}$, stage wherein h is an integer greater than 3;

except for the first-stage shift register, a second reset control signal terminal of a shift register of an $m^{th}$ stage is connected to a first reset control signal terminal of a shift register of an $(m-1)^{th}$ stage, wherein m is an integer greater than 2;

the $j^{th}$ stage is connected to an input signal terminal of a shift register of a $(j+2)^{th}$ stage, wherein j is an integer greater than 2;

input signal terminals of the first-stage shift register and the second-stage shift register are connected to a frame start signal terminal;

wherein the node control signal is a second clock signal, and a duty cycle of the second clock signal is 2% to 50%;

wherein the third clock signal has a phase opposite to the first clock signal; and wherein the second clock signal is different from the first and third clock signals.

3. The gate driving circuit according to claim 2, wherein, except for the first-stage shift register, a shift register of each of the remaining stages further comprises a frame initialization module; wherein an input terminal of the frame initialization module is connected to the frame start signal terminal, an output terminal of the frame initialization module is connected to the second node;

the frame initialization module is configured to initialize the driving signal output terminal of the shift register under the control of the frame start signal terminal.

4. The gate driving circuit according to claim 3, wherein the frame initialization module comprises a sixteenth switch transistor, wherein a gate and a source of the sixteenth switch transistor are both connected to the frame start signal terminal, a drain of the sixteenth switch transistor is connected to the second node.

* * * * *